(12) United States Patent
Liu et al.

(10) Patent No.: US 12,501,789 B2
(45) Date of Patent: Dec. 16, 2025

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Biao Liu, Beijing (CN); Peng Xu, Beijing (CN); Mengmeng Du, Beijing (CN); Rong Wang, Beijing (CN); Yixuan Long, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 910 days.

(21) Appl. No.: 17/418,865

(22) PCT Filed: Aug. 27, 2020

(86) PCT No.: PCT/CN2020/111565
§ 371 (c)(1),
(2) Date: Jun. 28, 2021

(87) PCT Pub. No.: WO2022/041022
PCT Pub. Date: Mar. 3, 2022

(65) Prior Publication Data
US 2022/0310752 A1    Sep. 29, 2022

(51) Int. Cl.
*H10K 59/131* (2023.01)
(52) U.S. Cl.
CPC ................. *H10K 59/131* (2023.02)

(58) Field of Classification Search
CPC .......... H10K 2102/311; H10K 59/131; H10K 77/111; H10K 21/311
See application file for complete search history.

(56) References Cited

U.S. PATENT DOCUMENTS

2017/0358641 A1* 12/2017 Park ................... H10K 77/111
2018/0286938 A1* 10/2018 Moon ................ H10K 59/124
(Continued)

FOREIGN PATENT DOCUMENTS

CN    107833906 A    3/2018
CN    109216375 A    1/2019
(Continued)

*Primary Examiner* — Eric K Ashbahian
(74) *Attorney, Agent, or Firm* — Ling Wu; Stephen Yang; Ling and Yang Intellectual Property

(57) ABSTRACT

Provided is a display substrate, including a base substrate, multiple sub-pixels, multiple data lines, a first wiring layer, a second wiring layer and a first insulator layer. The base substrate includes a display region and a bending region located on a side of the display region. The multiple sub-pixels are located in the display region, the multiple data lines are located in the display region and electrically connected to the multiple sub-pixels, and the multiple data lines are configured to provide data signals to the multiple sub-pixels. The first wiring layer is partially disposed in the bending region of the base substrate and is connected to the multiple data lines. The second wiring layer is located in the bending region and disposed on a side of the first wiring layer away from the base substrate, and is connected to the first wiring layer.

19 Claims, 19 Drawing Sheets

(56) References Cited

U.S. PATENT DOCUMENTS

| | | | |
|---|---|---|---|
| 2019/0013373 A1 | 1/2019 | Lee et al. | |
| 2019/0221617 A1 | 7/2019 | Jin et al. | |
| 2019/0252483 A1 | 8/2019 | Jeon | |
| 2019/0312092 A1* | 10/2019 | Kimura | H10K 59/124 |
| 2019/0355799 A1* | 11/2019 | Jeong | H10K 59/124 |
| 2020/0089368 A1* | 3/2020 | Shim | H10K 71/00 |
| 2020/0161412 A1* | 5/2020 | Lin | G09F 9/301 |
| 2021/0210580 A1 | 7/2021 | Gong | |
| 2021/0225978 A1* | 7/2021 | Lim | H10K 59/123 |

FOREIGN PATENT DOCUMENTS

| | | | | |
|---|---|---|---|---|
| CN | 109378318 A | 2/2019 | | |
| CN | 111048566 A | 4/2020 | | |
| CN | 111063721 A | 4/2020 | | |
| CN | 111128080 A | 5/2020 | | |
| KR | 20200055481 | * 11/2018 | | H10K 59/805 |
| KR | 10-2020-0056847 A | 5/2020 | | |

* cited by examiner

DISPLAY SUBSTRATE AND DISPLAY APPARATUS

CROSS-REFERENCE TO RELATED APPLICATION

The present application is a U.S. National Phase Entry of International Application PCT/CN2020/111565 having an international filing date of Aug. 27, 2020, the content of which should be construed as being incorporated herein by reference.

TECHNICAL FIELD

The present disclosure relates to, but is not limited to, the field of display technology, in particular to a display substrate and a display apparatus.

BACKGROUND

Organic Light Emitting Diode (OLED) has advantages such as ultra-thinness, large viewing angle, active light emission, high brightness, continuous and adjustable color of emitted light, low cost, fast response speed, low power consumption, wide operating temperature range and flexible display, and has gradually become a promising next generation display technology. According to different drive modes, OLEDs may be divided into two types, Passive Matrix (PM) type and Active Matrix (AM) type. An AMO-LED is a current-driven device, in which an independent Thin Film Transistor (TFT) is used to control each sub-pixel, and each sub-pixel may be continuously and independently driven to emit light. With the rapid development of the AMOLED, the application scenarios of the AMOLED become more and more complex and strict.

SUMMARY

The following is a summary of subject matter described in detail herein. This summary is not intended to limit the protection scope of the claims.

An embodiment of the present disclosure provides a display substrate and a display apparatus.

In one aspect, an embodiment of the disclosure provides a display substrate, which includes a base substrate, multiple sub-pixels, multiple data lines, a first wiring layer, a second wiring layer and an inorganic insulator layer. The base substrate includes a display region and a bending region located on a side of the display region. The multiple sub-pixels are located in the display region. The multiple data lines are located in the display region and electrically connected to the multiple sub-pixels, and the multiple data lines are configured to provide data signals to the multiple sub-pixels. The first wiring layer is partially disposed in the bending region of the base substrate, and is connected to the multiple data lines. The second wiring layer is located in the bending region and disposed on a side of the first wiring layer away from the base substrate, and is connected to the first wiring layer. A first insulator layer is disposed on a side of the second wiring layer away from the base substrate, wherein an orthographic projection of the first insulator layer on the base substrate overlaps with an orthographic projection of an edge of the second wiring layer close to the display region on the base substrate overlap.

In some exemplary embodiments, the first wiring layer includes multiple data lead wires, and the multiple data lead wires are connected to the multiple data lines in a one-to-one correspondence. The second wiring layer includes multiple first data connection lines which are connected to the multiple data lead wires in a one-to-one correspondence. The first insulator layer directly contacts with at least part of the second wiring layer.

In some exemplary embodiments, the display substrate further includes an inorganic insulator layer located between the second wiring layer and the first insulator layer. The inorganic insulator layer includes a first edge in the bending region, and the first edge of the inorganic insulator layer overlaps with an orthographic projection of an edge of the second wiring layer close to the display region on the base substrate.

In some exemplary embodiments, the first edge of the inorganic insulator layer is provided with a first wave structure, and the first wave structure includes multiple first notches disposed at intervals. An orthographic projection of at least one of the multiple first notches on the base substrate is located in an orthographic projection of a corresponding first data connection line on the base substrate.

In some exemplary embodiments, the multiple first data connection lines of the second wiring layer are disposed in a staggered manner.

In some exemplary embodiments, the display substrate further includes a third wiring layer located in the bending region and disposed on a side of the first insulator layer away from the base substrate. The third wiring layer includes multiple second data connection lines which are connected to the multiple first data connection lines of the second wiring layer in a one-to-one correspondence. An orthographic projection of at least one of the multiple second data connection lines on the base substrate partially overlaps with an orthographic projection of a corresponding first data connection line on the base substrate.

In some exemplary embodiments, at least one of the multiple second data connection lines has at least one hole.

In some exemplary embodiments, the at least one hole is a round hole or an elliptical hole.

In some exemplary embodiments, the second wiring layer further includes multiple third data connection lines. The multiple third data connection lines are located on a side of the multiple first data connection lines away from the display region, and the multiple third data connection lines are connected to the multiple second data connection lines in a one-to-one correspondence. Two ends of at least one of the multiple second data connection lines are respectively connected to one of the first data connection lines and one of the third data connection lines.

In some exemplary embodiments, the multiple third data connection lines of the second wiring layer are disposed in a staggered manner.

In some exemplary embodiments, the inorganic insulator layer further includes a second edge in the bending region, and the second edge is located on a side of the first edge away from the display region. A hollow region of the inorganic insulator layer is between the first edge and the second edge of the inorganic insulator layer. The second edge of the inorganic insulator layer directly contacts with at least one of the third data connection lines of the second wiring layer, and the second edge covers an edge of the third data connection line away from the display region.

In some exemplary embodiments, the second edge of the inorganic insulator layer is provided with a second wave structure, and the second wave structure includes multiple second notches disposed at intervals. An orthographic projection of at least one of the multiple second notches on the base substrate is located in an orthographic projection of a corresponding third data connection line on the base substrate.

In some exemplary embodiments, the first edge of the inorganic insulator layer directly contacts with at least one of the first data connection line of the second wiring layer and covers the edge of the first data connection line close to the display region.

In some exemplary embodiments, in the bending region, along a direction from the bending region to the display region, a distance between the first edge of the inorganic insulator layer and an edge of the second wiring layer covered by the first edge is greater than or equal to 5 microns.

In some exemplary embodiments, the first insulator layer includes multiple first openings in the bending region. An orthographic projection of at least one of the multiple first data connection lines on the base substrate includes an orthographic projection of at least one of the first openings on the base substrate.

In some exemplary embodiments, the first wiring layer includes a first data lead wire layer and a second data lead wire layer which are sequentially disposed on the base substrate and mutually insulated. The first data lead wire layer includes multiple first data lead wires, and the second data lead wire layer includes multiple second data lead wires. An orthographic projection of the first data lead wire layer on the base substrate do not overlap with an orthographic projection of the second data lead wire layer on the base substrate, and the first data lead wires and the second data lead wires are disposed at intervals.

In some exemplary embodiments, the first data lead wire layer further includes multiple fourth data connection lines which are located on a side of the multiple first data lead wires away from the display region, and are connected to the multiple first data lead wires in a one-to-one correspondence at least through the second wiring layer. The second data lead wire layer further includes multiple fifth data connection lines which are located on a side of the multiple second data lead wires away from the display region and are connected to the multiple second data lead wires in a one-to-one correspondence at least through the second wiring layer.

In some exemplary embodiments, the display region at least includes a drive structure layer disposed on the base substrate, and a light emitting element disposed on the drive structure layer; the light emitting element is connected to the drive structure layer. The drive structure layer includes an active layer, a first gate metal layer, a second gate metal layer and a source and drain electrode layer which are sequentially disposed on the base substrate. The first data lead wire layer and the first gate metal layer are in a same layer, the second data lead wire layer and the second gate metal layer are in a same layer, and the second wiring layer and the source and drain electrode layer are in a same layer.

In some exemplary embodiments, the bending region includes a first region, a second region, and a third region which are sequentially disposed along a direction away from the display region. The second region includes a composite insulator layer which is disposed between the base substrate and the second wiring layer. The composite insulator layer is provided with a first groove and a second groove which are communicated. An orthographic projection of the first groove on the base substrate includes an orthographic projection of the second groove on the base substrate.

In some exemplary embodiments, the composite insulator layer includes a barrier layer, a buffer layer, a first gate insulator layer, a second gate insulator layer, and an interlayer dielectric layer which are stacked on the base substrate. The first groove exposes the buffer layer, and the second groove exposes the base substrate.

In some exemplary embodiments, the first insulator layer is filled at least in the second groove.

In some exemplary embodiments, the first insulator layer fills the first groove and the second groove.

In some exemplary embodiments, the first insulator layer is an organic insulator layer.

In another aspect, the embodiment of the present disclosure provides a display apparatus, including the display substrate described above.

Other aspects will become apparent after the drawings and the detailed description are read and understood.

BRIEF DESCRIPTION OF DRAWINGS

Drawings are used to provide a further understanding of technical solutions of the present disclosure and form a part of the specification to explain the technical solutions of the present disclosure together with embodiments of the present disclosure, which do not constitute any limitation on the technical solutions of the present disclosure. Shapes and sizes of one or more components in the accompanying drawings do not reflect real scales, and are only for a purpose of schematically illustrating contents of the present disclosure.

DETAILED DESCRIPTION

Figure 1:
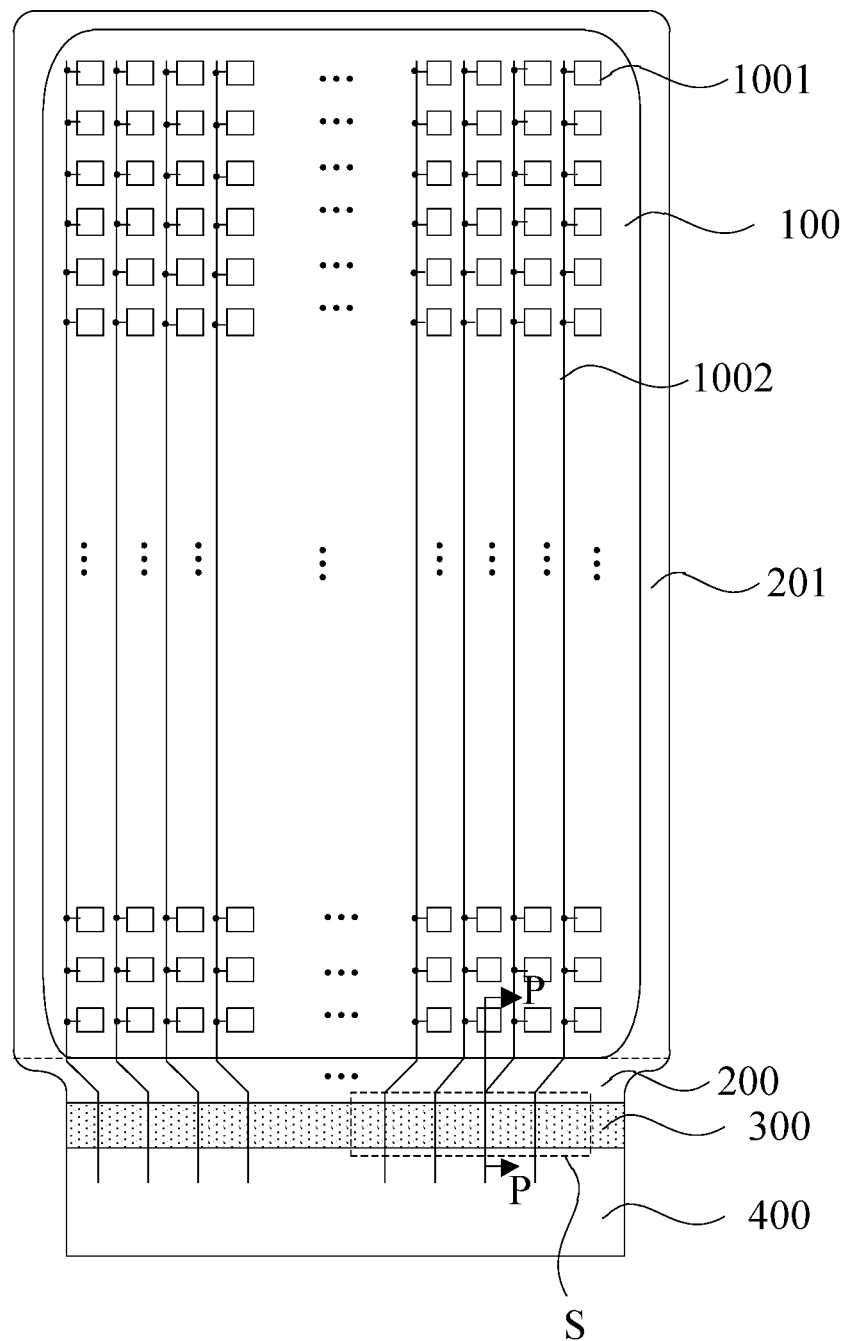
FIG. 1 is a schematic diagram of a display substrate according to at least one embodiment of the present disclosure.

To make the objects, technical solutions and advantages of the present disclosure more clear, embodiments of the present disclosure will be described in detail below with reference to the drawings. The embodiments may be implemented in a number of different forms. Those of ordinary skills in the art will readily understand the fact that implementations and contents may be transformed into one or more forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, the sizes of one or more constituent elements, or the thickness or regions of layers, are sometimes exaggerated for clarity. Therefore, an implementation of the present disclosure is not necessarily limited to the sizes shown. The shapes and sizes of components in the drawings do not reflect true scales. In addition, the drawings schematically show ideal examples, and an implementation of the present disclosure is not limited to the shapes or values shown in the drawings.

The "first", "second", "third" and other ordinal numbers in the present disclosure are used to avoid confusion of constituent elements, not to provide any quantitative limitation. In the present disclosure, "multiple (or a plurality of)" means two or more quantities.

In the present disclosure, for the sake of convenience, wordings such as "central", "upper", "lower", "front", "rear", "vertical", "horizontal", "top", "bottom", "inner", "outer" and the others describing the orientations or positional relations are used to depict relations between constituent elements with reference to the drawings, which are only for an easy and simplified description of the present specification, rather than for indicating or implying that the apparatus or element referred to must have a specific orientation, or must be constructed and operated in a particular orientation and therefore, those wordings cannot be construed as limitations on the present disclosure. The positional relations between the constituent elements are appropriately changed according to the direction in which each constituent element is described. Therefore, they are not limited to the wordings in the specification, and may be replaced appropriately according to the situations.

In the present disclosure, the terms "installed", "connected" and "coupled" shall be understood in their broadest sense unless otherwise explicitly specified and defined. For example, a connection may be a fixed connection, or may be a detachable connection, or an integrated connection; it may be a mechanical connection, or may be an electrical connection; it may be a direct connection, or may be an indirect connection through middleware, or may be an internal connection between two elements. Those of ordinary skills in the art can understand the specific meanings of the above mentioned terms in the present disclosure according to specific context.

In the present disclosure, a transistor refers to an element including at least three terminals, namely, a gate electrode, a drain electrode and a source electrode. The transistor has a channel region between the drain electrode (also referred to as a drain electrode terminal, a drain region or a drain electrode) and the source electrode (also referred to as a source electrode terminal, a source region or a source electrode), and current can flow through the drain electrode, the channel region and the source electrode. In the present disclosure, the channel region refers to an region through which current mainly flows.

In the present disclosure, a first electrode may be a drain electrode while a second electrode may be a source electrode, or the first electrode may be a source electrode while the second electrode may be a drain electrode. The functions of the "source electrode" and that of the "drain electrode" are interchangeable under circumstances where transistors with opposite polarities are used or where the current direction changes during circuit operation. Therefore, in the present disclosure, "the source electrode" and "the drain electrode" are interchangeable.

In the present disclosure, "an electrical connection" includes a case where constituent elements are connected via an element having a certain electrical function. The "element having a certain electrical action" is not particularly limited as long as it can transmit and receive electrical signals between connected constituent elements. Examples of the "element having a certain electrical function" not only include electrodes and wirings, but also include switching elements such as transistors, resistors, inductors, capacitors, and other elements with one or more functions.

In the present disclosure, "parallel" refers to a state in which an angle formed by two straight lines is above −10 degrees and below 10 degrees, and thus may include a state in which the angle is above −5 degrees and below 5 degrees. In addition, "vertical" refers to a state in which an angle formed by two straight lines is above 80 degrees and below 100 degrees, and thus may include a state in which the angle is above 85 degrees and below 95 degrees.

In the present disclosure, "film" and "layer" are interchangeable. For example, sometimes "conductive layer" may be replaced by "conductive film". Similarly, "insulator thin film" may sometimes be replaced by "insulator layer".

In the present specification, "about" means that there is no strict limit for a value, and values within an error range during processes and measurement are allowed.

At least one embodiment of the present disclosure provides a display substrate, which includes a base substrate, multiple sub-pixels, multiple data lines, a first wiring layer, a second wiring layer and a first insulator layer. The base substrate includes a display region and a bending region located on a side of the display region. The multiple sub-pixels are located in the display region. The multiple data lines are located in the display region and electrically connected to the multiple sub-pixels, and the multiple data lines are configured to provide data signals to the multiple sub-pixels. The first wiring layer is partially disposed in the bending region of the base substrate. The first wiring layer is connected to the multiple data lines. The second wiring layer is located in the bending region and is disposed on a side of the first wiring layer away from the base substrate. The second wiring layer is connected to the first wiring layer. The first insulator layer is disposed on a side of the second wiring layer away from the base substrate. An orthographic projection of the first insulator layer overlaps with an orthographic projection of an edge of the second wiring layer close to the display region on the base substrate.

According to the display substrate provided by the embodiment of the present disclosure, in the bending region, the orthographic projection of the first insulator layer on the base substrate overlaps with the orthographic projection of the edge of the second wiring layer close to the display region on the base substrate, which is beneficial to protecting the first wiring layer in the bending region, thereby improving the corrosion resistance of the display substrate and further prolonging the service life of the display substrate in extreme environments.

In some exemplary embodiments, the first wiring layer includes multiple data lead wires, wherein the multiple data lead wires are connected to the multiple data lines in a one-to-one correspondence. The second wiring layer includes multiple first data connection lines which are connected to the multiple data lead wires in a one-to-one correspondence. The first insulator layer directly contacts with at least part of the second wiring layer. In this exemplary embodiment, the first insulator layer extends from the display region to the bending region and directly contacts with at least part of the second wiring layer. In some examples, in the bending region, any data lead wire is connected in series to one first data connection line to realize data signal transmission between the display region and the bonding region. However, this is not limited in the present embodiment. In some exemplary embodiments, the display substrate of the present embodiment further includes an inorganic insulator layer located between the second wiring layer and the first insulator layer. The inorganic insulator layer includes a first edge in the bending region, wherein an orthographic projection of the first edge of the inorganic insulator layer on the base substrate overlaps with an orthographic projection of an edge of the second wiring layer close to the display region on the base substrate. In this exemplary embodiment, the inorganic insulator layer extends from the display region to the bending region and covers the edge of the second wiring layer close to the display region in the bending region, which is beneficial to protecting the first wiring layer in the bending region, thereby improving the corrosion resistance of the display substrate and further prolonging the service life of the display substrate in extreme environments.

In some exemplary embodiments, the first edge of the inorganic insulator layer directly contacts with at least one first data connection line of the second wiring layer and covers the edge of the first data connection line close to the display region.

In some exemplary embodiments, multiple first data connection lines of the second wiring layer are disposed in a staggered manner. For example, the multiple first data connection lines are disposed in two rows, wherein first data connection lines in the second row are located on a side of first data connection lines in the first row away from the display region, and there is a misalignment between the first data connection lines in the first row and the first data connection lines in the second row. However, this is not limited in the present embodiment. In some examples, distances between the multiple first data connection lines of the second wiring layer and the edge of the display region may be the same.

In some exemplary embodiments, the first edge of the inorganic insulator layer is provided with a first wave structure, and the first wave structure includes multiple first notches disposed at intervals. An orthographic projection of at least one of the multiple first notches on the base substrate is located within an orthographic projection of a corresponding first data connection line on the base substrate. In some examples, the multiple first notches may correspond to the multiple first data connection lines of the second wiring layer one by one, or the multiple first notches may correspond to a part of the multiple first data connection lines of the second wiring layer one by one. In this exemplary embodiment, stress concentration of the inorganic insulator layer during bending can be reduced, and cracks in the inorganic insulator layer may be prevented by disposing the first wave structure at the first edge of the inorganic insulator layer, thereby improving a bending effect. However, this is not limited in the present embodiment. In some examples, the first edge of the inorganic insulator layer may be a straight edge.

In some exemplary embodiments, the display substrate of the present embodiment may further include a third wiring layer located in the bending region and disposed on a side of the first insulator layer away from the base substrate. The third wiring layer includes multiple second data connection lines which are connected to the multiple first data connection lines of the second wiring layer in a one-to-one correspondence. An orthographic projection of at least one of the multiple second data connection lines on the base substrate partially overlaps with an orthographic projection of a corresponding first data connection line on the base substrate. In some examples, in the bending region, any data lead wire is sequentially connected in series to one first data connection line and one second data connection line to realize data signal transmission between the display region and the bonding region. However, this is not limited in the present embodiment.

In some exemplary embodiments, at least one of the multiple second data connection lines has at least one hole. In some examples, the at least one hole may be circular or elliptical. However, this is not limited in the present embodiment.

In some exemplary embodiments, the second wiring layer may include multiple first data connection lines and multiple third data connection lines. The multiple third data connection lines are located on a side of the multiple first data connection lines away from the display region. The multiple third data connection lines are connected to multiple second data connection lines of the third wiring layer in a one-to-one correspondence. Two ends of at least one of the multiple second data connection lines are respectively connected to one first data connection line and one third data connection line. In some examples, in the bending region, any data lead wire is sequentially connected in series to one first data connection line, one second data connection line and one third data connection line in order to realize data signal transmission between the display region and the bonding region. However, this is not limited in the present embodiment.

In some exemplary embodiments, the multiple third data connection lines of the second wiring layer are disposed in a staggered manner. For example, the multiple third data connection lines are disposed in two rows, and third data connection lines in the second row are located on a side of third data connection lines in the first row away from the display region, and there is a misalignment between the third data connection line in the first row and the third data connection line in the second row. However, this is not limited in the present embodiment. In some examples, distances between the multiple third data connection lines of the second wiring layer and the edge of the display region may be the same.

In some exemplary embodiments, the inorganic insulator layer further includes a second edge in the bending region, wherein the second edge of the inorganic insulator layer is located on a side of the first edge away from the display region. A hollow region of the inorganic insulator layer is formed between the first edge and the second edge of the inorganic insulator layer. The second edge of the inorganic insulator layer directly contacts with at least one third data connection line of the second wiring layer, and covers an edge of the third data connection line away from the display region.

In some exemplary embodiments, the second edge of the inorganic insulator layer is provided with a second wave structure, wherein the second wave structure includes multiple second notches disposed at intervals. An orthographic projection of at least one of the multiple second notches on the base substrate is located within an orthographic projection of a corresponding third data connection line on the base substrate. In some examples, the multiple second notches may correspond to the multiple third data connection lines of the second wiring layer one by one, or the multiple second notches may correspond to a part of the multiple third data connection lines of the second wiring layer one by one. In this exemplary embodiment, stress concentration of the inorganic insulator layer during bending can be reduced, and cracks in the inorganic insulator layer may be prevented by disposing the second wave structure at the second edge of the inorganic insulator layer, thereby improving a bending effect. However, this is not limited in the present embodiment. In some examples, the second edge of the inorganic insulator layer may be a straight edge.

In some exemplary embodiments, in the bending region, along a direction from the bending region to the display region, a distance between the first edge of the inorganic insulator layer and an edge of the second wiring layer covered by the first edge is greater than or equal to 5 microns (μm).

In some exemplary embodiments, the first insulator layer includes multiple first openings in the bending region. An orthographic projection of at least one of the multiple first data connection lines on the base substrate includes an orthographic projection of at least one first opening on the base substrate. In some examples, the multiple first openings correspond to multiple first data connection lines of the second wiring layer one by one, and an orthographic projection of one first opening on the base substrate is located within an orthographic projection of a corresponding first data connection line on the base substrate. In some examples, at least one of the multiple first data connection lines corresponds to two or more first openings, and an orthographic projection of the two or more first openings on the base substrate is located within an orthographic projection of a corresponding first data connection line on the base substrate. In some examples, an orthographic projection of at least one of the multiple first openings on the base substrate does not overlap or partially overlaps with an orthographic projection of the first edge of the inorganic insulator layer on the base substrate. However, this is not limited in the present embodiment.

In some exemplary embodiments, the first wiring layer includes a first data lead wire layer and a second data lead wire layer which are sequentially disposed on the base substrate and mutually insulated. The first data lead wire layer includes multiple first data lead wires, and the second data lead wire layer includes multiple second data lead wires. Orthographic projections of the first data lead wire layer and the second data lead wire layer on the base substrate do not overlap with each other, and the first data lead wires and the second data lead wires are disposed at intervals. However, this is not limited in the present embodiment. For example, the multiple first data lead wires and the multiple second data lead wires may be disposed in a same layer.

In some exemplary embodiments, the first data lead wire layer includes multiple first data lead wires and multiple fourth data connection lines, wherein the multiple fourth data connection lines are located on a side of the multiple first data lead wires away from the display region. The multiple fourth data connection lines are connected to the multiple first data lead wires in a one-to-one correspondence at least through the second wiring layer. The second data lead wire layer includes multiple second data lead wires and multiple fifth data connection lines, wherein the multiple fifth data connection lines are located on a side of the multiple second data lead wires away from the display region. The multiple fifth data connection lines are connected to the multiple second data lead wires in a one-to-one correspondence at least through the second wiring layer. In some examples, in the bending region, any first data lead wire is sequentially connected in series to one first data connection line, one second data connection line, one third data connection line and one fourth data connection line, and any second data lead wire is sequentially connected in series to one first data connection line, one second data connection line, one third data connection line and one fifth data connection line in order to realize data signal transmission between the display region and the bonding region. However, this is not limited in the present embodiment.

In some exemplary embodiments, the display region at least includes a drive structure layer disposed on the base substrate, and a light emitting element disposed on the drive structure layer, wherein the light emitting element is connected to the drive structure layer. The drive structure layer includes an active layer, a first gate metal layer, a second gate metal layer and a source and drain electrode layer which are sequentially disposed on the base substrate. The first data lead wire layer and the first gate metal layer are in a same layer, the second data lead wire layer and the second gate metal layer are in a same layer, and the second wiring layer and the source and drain electrode layer are in a same layer. However, this is not limited in the present embodiment. In some examples, the first wiring layer and the second gate metal layer may be in a same layer, or the first wiring layer and the first gate metal layer may be in a same layer.

In some exemplary embodiments, the display region at least includes a drive structure layer disposed on the base substrate, a metal conductive layer disposed on the drive structure layer, and a light emitting element disposed on the metal conductive layer, wherein the light-emitting element is connected to the drive structure layer through the metal conductive layer. The drive structure layer includes an active layer, a first gate metal layer, a second gate metal layer and a source and drain electrode layer which are sequentially disposed on the base substrate. The first data lead wire layer and the first gate metal layer are in a same layer, the second data lead wire layer and the second gate metal layer are in a same layer, the second wiring layer and the source and drain electrode layer are in a same layer, and the third wiring layer and the metal conductive layer are in a same layer. However, this is not limited in the present embodiment.

In some exemplary embodiments, the bending region of the present embodiment includes a first region, a second region, and a third region which are sequentially disposed along a direction away from the display region. The second region includes a composite insulator layer which is disposed between the base substrate and the second wiring layer. The composite insulator layer is provided with a first groove and a second groove which are communicated. An orthographic projection of the first groove on the base substrate includes an orthographic projection of the second groove on the base substrate.

In some exemplary embodiments, the composite insulator layer may include a barrier layer, a buffer layer, a first gate insulator (GI) layer, a second gate insulator layer, and an interlayer dielectric (ILD) layer stacked on the base substrate. The first groove exposes the buffer layer, and the second groove exposes the base substrate.

In some exemplary embodiments, the first insulator layer is filled at least in the second groove.

In some exemplary embodiments, the first insulator layer fills the first groove and the second groove.

In some exemplary embodiments, the first insulator layer is an organic insulator layer. In other words, the first insulator layer is made of an organic material.

FIG. 1 is a schematic diagram of a display substrate according to at least one embodiment of the present disclosure. As shown in FIG. 1, the display substrate according to the present embodiment includes a display region 100 and a non-display region located around the display region 100. The non-display regions include a first fanout region 200 located on a side of the display region 100, a bending region 300 located on a side of the first fanout region 200 away from the display region 100, a bonding region 400 located on a side of the bending region 300 away from the display region 100, and a bezel region 201 located on a periphery of the display region 100 away from the first fanout region 200. The bezel region 201 communicates with the first fanout region 200 and surrounds the display region 100. The first fanout region 200 is located between the display region 100 and the bending region 300, and the bending region 300 is located between the first fanout region 200 and the bonding region 400.

In some exemplary embodiments, the display region 100 at least includes multiple display units (i.e., sub-pixels) 1001, multiple gate lines (not shown in figures), and multiple data lines 1002. Orthogonal projections of the multiple gate lines and the multiple data lines 1002 on the base substrate overlap with each other to form multiple sub-pixel regions, and one display unit 1001 is disposed in one sub-pixel region. The multiple data lines 1002 are electrically connected to the multiple display units 1001, and the multiple data lines 1002 are configured to provide data signals to the multiple display units 1001. The multiple gate lines are electrically connected to the multiple display units 1001, and the multiple gate lines are configured to provide scanning signals to the multiple display units 1001. In some examples, one pixel may include three display units, which are respectively a red sub-pixel, a green sub-pixel and a blue sub-pixel. However, this is not limited in the present embodiment. In some examples, one pixel may include four display units, which are respectively a red sub-pixel, a green sub-pixel, a blue sub-pixel and a white sub-pixel.

In some exemplary embodiments, the bezel region 201 at least includes a gate drive circuit that provides scanning signals to the multiple display units 1001 of the display region 100, and a power supply line (e.g., a low voltage power supply line (VSS)) that transmits voltage signals to the multiple display units 1001. The first fanout region 200 includes a data fanout line, a first power supply line and a second power supply line. The data fanout line is located in middle of the first fanout region 200, and includes multiple data lead wires, which are configured to be connected to the data lines 1002 of the display region 100 in a fanout way. The first power supply line is configured to be connected to a high voltage power supply line (VDD) of the display region 100. The second power supply line is configured to be connected to a low voltage power supply line (VSS) of the bezel region 201. In some examples, the first power supply line and the second power supply line are disposed in a same layer, and the first power supply line and the second power supply line are disposed in different layers from the data fanout line. An orthographic projection of the data fanout line on the base substrate partially overlaps with an orthographic projection of the first power supply line on the base substrate, and the orthographic projection of the data fanout line on the base substrate partially overlaps with an orthographic projection of the second power supply line on the base substrate. The bending region 300 is configured to bend the bonding region 400 to a back of the display region 100. The bending region 300 at least includes multiple data connection lines, which are configured to be connected to the multiple data lead wires of the first fanout region 200 and an integrated circuit (IC) of the bonding region 400. In some examples, the bonding region 400 may include a second fanout region, an anti-static region, a drive chip region, and a binding electrode region which are sequentially disposed in the direction away from the display region 100. The second fanout region may include multiple data connection lines led out in a fanout way. The anti-static region includes an anti-static circuit configured to prevent electrostatic damage to the display substrate by eliminating static electricity. The driver chip region may include an integrated circuit configured to be connected to the multiple data connection lines. The bonding electrode region includes multiple bonding pads configured to be bonded and connected to an external flexible printed circuit (FPC).

Figure 2:
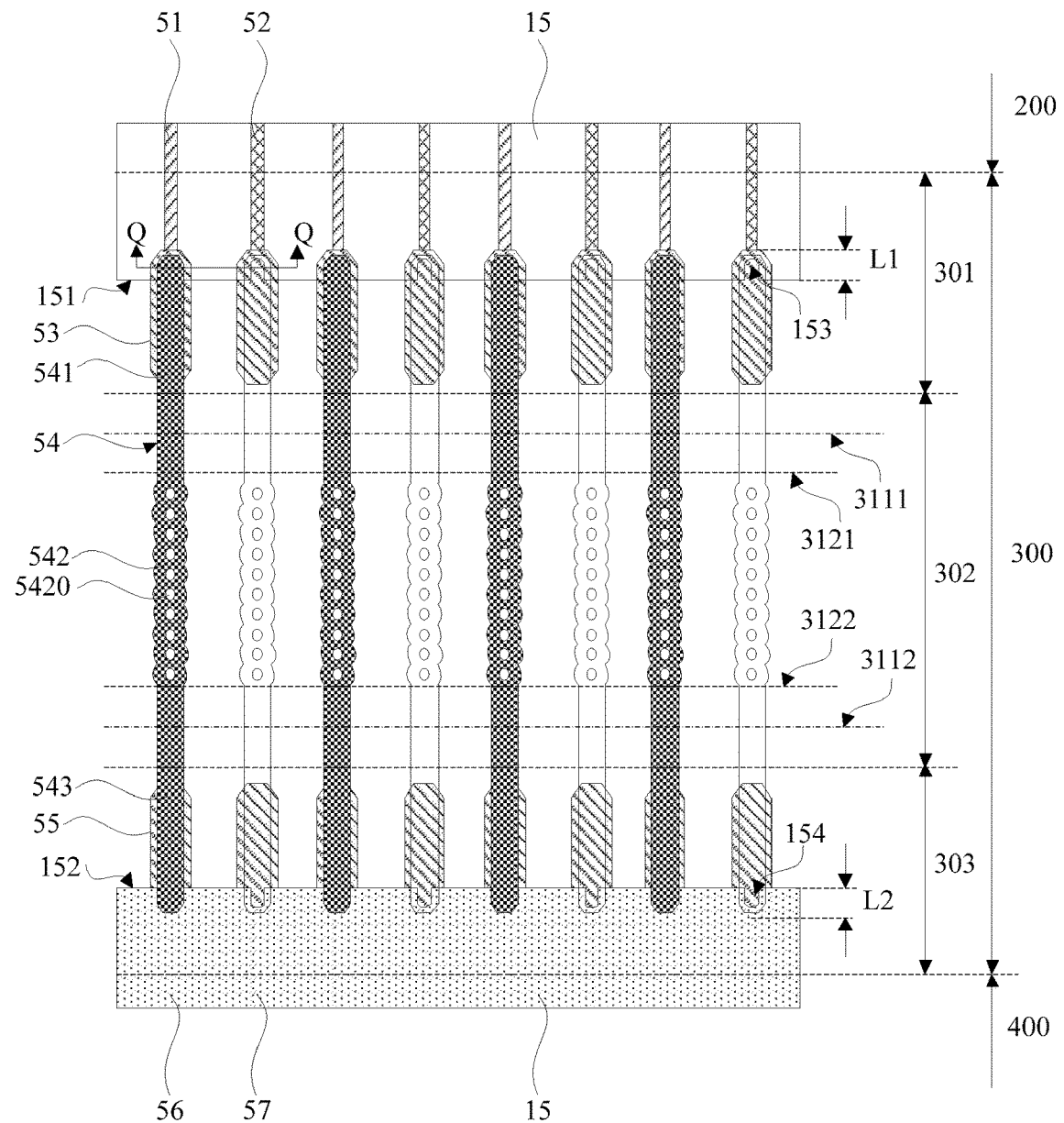
FIG. 2 is a schematic diagram of a structure of a bending region of a display substrate according to at least one embodiment of the present disclosure.
Figure 3:
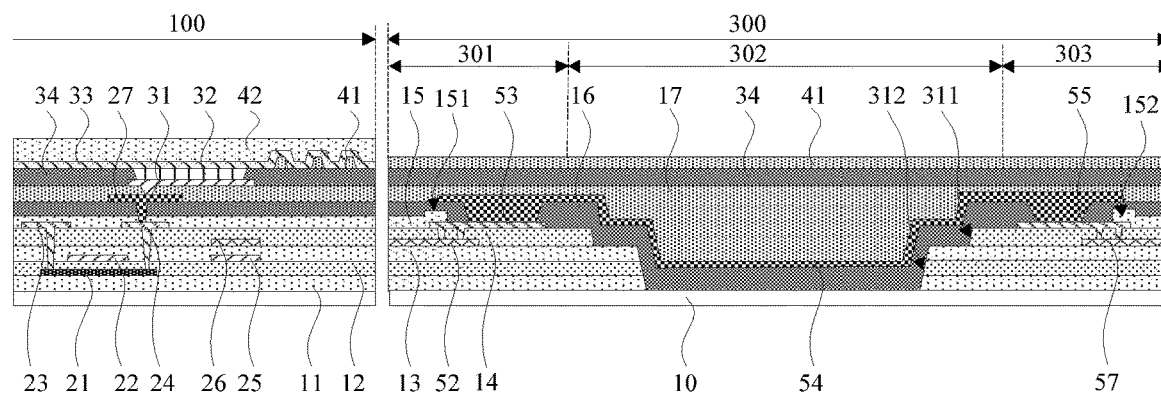
FIG. 3 is a cross sectional view along P-P direction in FIG. 1.
Figure 4:
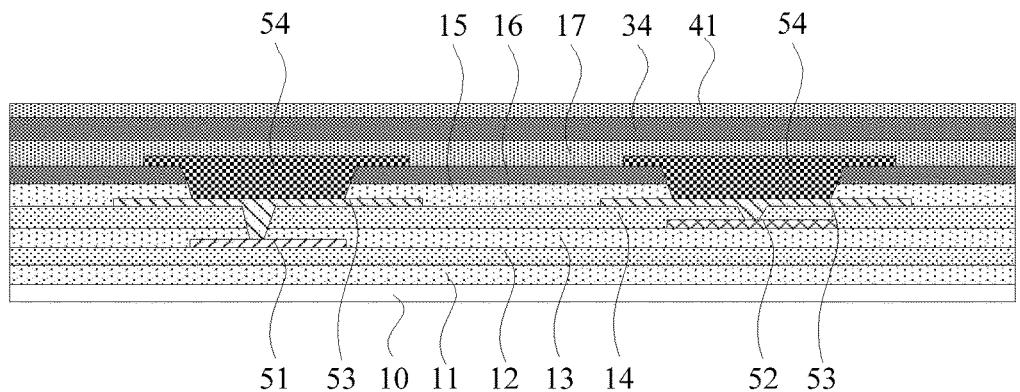
FIG. 4 is a cross sectional view along a Q-Q direction in FIG. 2.

FIG. 2 is a schematic diagram of a structure of a bending region according to at least one embodiment of the present disclosure. FIG. 2 is a partial enlarged view of region S in FIG. 1. FIG. 3 is a cross sectional view along P-P direction in FIG. 1. FIG. 4 is a cross sectional view along Q-Q direction in FIG. 2.

In some exemplary embodiments, as shown in FIGS. 1 and 2, in a plane parallel to the display substrate, the display substrate may include a display region 100, a first fanout region 200 on a side of the display region 100, a bending region 300 on a side of the first fanout region 200 away from the display region 100, and a bonding region 400 on a side of the bending region 300 away from the display region 100. The bending region 300 includes a first region 301, a second region 302, and a third region 303 which are sequentially disposed along a direction away from the display region 100. The first region 301 of the bending region 300 is adjacent to the first fanout region 200, and the third region 303 of the bending region 300 is adjacent to the bonding region 400. The second region 302 of the bending region 300 is located between the first region 301 and the third region 303. The second region 302 of the bending region 300 is provided with a first groove formed by an EBA MASK (Etch Bending A MASK) process and a second groove formed by an EBB MASK (Etch Bending B MASK) process. As shown in FIG. 2, a first boundary 3111 and a second boundary 3112 are boundaries of the first groove formed by the EBA MASK process, and a third boundary 3121 and a fourth boundary 3122 are boundaries of the second groove formed by the EBB MASK process.

In some exemplary embodiments, as shown in FIG. 2, in a plane parallel to the display substrate, the bending region 300 includes multiple first data lead wires 51, multiple second data lead wires 52, multiple first data connection lines 53, multiple second data connection lines 54, multiple third data connection lines 55, multiple fourth data connection lines 56 and multiple fifth data connection lines 57. The multiple first data lead wires 51, the multiple second data lead wires 52, the multiple first data connection lines 53, the multiple second data connection lines 54, the multiple third data connection lines 55, the multiple fourth data connection lines 56 and the multiple fifth data connection lines 57 all extend along a first direction. The multiple first data lead wires 51 and the multiple second data lead wires 52 are disposed along a second direction perpendicular to the first direction, and the first data lead wires 51 and the second data lead wires 52 are disposed at intervals. The multiple first data connection lines 53 are located in the first region 301 of the bending region 300 and disposed along the second direction. The multiple third data connection lines 55 are located in the third region 303 of the bending region 300 and disposed along the second direction. The multiple second data connection lines 54 are disposed along the second direction. The multiple fourth data connection lines 56 and the multiple fifth data connection lines 57 are all disposed along the second direction, and the fourth data connection lines 56 and the fifth data connection lines 57 are disposed at intervals.

In some exemplary embodiments, as shown in FIG. 2, the multiple first data lead wires 51 extend from the first fanout region 200 to the first region 301 of the bending region 300, and the multiple second data lead wires 52 extend from the first fanout region 200 to the first region 301 of the bending region 300. The multiple first data lead wires 51 and the multiple second data lead wires 52 are connected to multiple data lines in the display region in a one-to-one correspondence, for example, any first data lead wire 51 or any second data lead wires 52 is connected to one data line. The multiple first data lead wires 51 and the multiple second data lead wires 52 are insulatedly disposed in different layers, and the first data lead wires 51 and the second data lead wires 52 are disposed at intervals. The multiple first data lead wires 51 and the multiple second data lead wires 52 are connected to the multiple first data connection lines 53 in a one-to-one correspondence. For example, any first data lead wire 51 or any second data lead wire 52 is connected to one first data connection line 53. The multiple first data connection lines 53 are disposed in the first region 301 of the bending region 300 and are mutually insulated. The multiple third data connection lines 55 are disposed in the third region 303 of the bending region 300 and are mutually insulated. The multiple first data connection lines 53 and the multiple third data connection lines 55 are disposed in a same layer. The multiple second data connection lines 54 extend from the first region 301 to the third region 303 via the second region 302 and are mutually insulated. The multiple third data connection lines 55 are disposed in the third region 303 of the bending region 300 and mutually insulated. The multiple second data connection lines 54 are connected to the multiple first data connection lines 51 in a one-to-one correspondence, and the multiple second data connection lines 54 are connected to the multiple third data connection lines 55 in a one-to-one correspondence. The multiple fourth data connection lines 56 extend from the third region 303 of the bending region 300 to the bonding region 400, and the multiple fifth data connection lines 57 extend from the third region 303 of the bending region 300 to the bonding region 400. The multiple fourth data connection lines 56 and the multiple fifth data connection lines 57 may be connected to an integrated circuit in the bonding region 400. The multiple fourth data connection lines 56 and the multiple fifth data connection lines 57 are insulatedly disposed in different layers, and the fourth data connection lines 56 and the fifth data connection lines 57 are disposed at intervals. The multiple fourth data connection lines 56 and the multiple first data lead wires 51 are disposed in a same layer, and the fifth data connection lines 57 and the multiple second data lead wires 52 are disposed in a same layer. Any third data connection line 55 is connected to one fourth data connection line 56 or one fifth data connection line 57. In other words, any first data lead wire 51 is sequentially connected in series to one first data connection line 53, one second data connection line 54, one third data connection line 55 and one fourth data connection line 56, and any second data lead wire 52 is sequentially connected in series to one first data connection line 53, one second data connection line 54, one third data connection line 55 and one fifth data connection line 57. In the bending region 300, multiple data lead wires (including first data lead wires and second data lead wires) and multiple data connection lines (including first data connection lines to fifth data connection lines) are disposed to realize signal transmission between data lines of the display region and the integrated circuit of the bonding region. In this exemplary embodiment, in the bending region 300, one first data lead wire (or one second data lead wire), one first data connection line, one second data connection line, one third data connection line and one fourth data connection line (or one fifth data connection line) are sequentially connected in series to realize one-way data signal transmission, so that the bending stress during bending may be dispersed on multiple data connection lines, to avoid stress concentration, thereby reducing risks of breakage of the data connection lines of the bending region so as to improve a bending effect.

In some exemplary embodiments, as shown in FIG. 2, in a plane parallel to the display substrate, the multiple first data lead wires 51, the multiple second data lead wires 52, the multiple fourth data connection lines 56, and the multiple fifth data connection lines 57 may have same shapes and sizes, for example, they are all strip-shaped. However, this is not limited in the present embodiment. For example, the shapes and sizes of the multiple first data lead wires and the multiple second data lead wires may be the same and different from those of the multiple fourth data connection lines and the multiple fifth data connection lines. In some examples, the shapes and sizes of the multiple first data connection lines 53 and the multiple third data connection lines 55 may be the same, for example, they are all rectangles (such as rounded rectangles) or polygons. However, this is not limited in the present embodiment. For example, the shapes and sizes of the multiple first data connection lines may be different from those of the multiple third data connection lines.

In some exemplary embodiments, as shown in FIG. 2, in a plane parallel to the display substrate, an orthographic projection of any first data connection line 53 on the base substrate overlaps with an orthographic projection of one first data lead wire 51 or one second data lead wire 52 on the base substrate, and an orthographic projection of any second data connection line 54 on the base substrate overlaps with an orthographic projection of one first data connection line 53 and one third data connection line 55 on the base substrate. An orthographic projection of any third data connection line 55 on the base substrate overlaps with an orthographic projection of one fourth data connection line 56 or one fifth data connection line 57 on the base substrate.

In some exemplary embodiments, as shown in FIG. 2, in a plane parallel to the display substrate, at least one second data connection line 54 among the multiple second data connection lines includes a first wire section 541, a second wire section 542, and a third wire section 543 connected in sequence. The first wire section 541 is located in the first region 301 of the bending region 300, the second wire section 542 is located in the second region 302, and the third wire section 543 is located in the third region 303. An orthographic projection of the first wire section 541 on the base substrate partially overlaps with an orthographic projection of one first data connection line 53 on the base substrate. An orthographic projection of the third wire section 543 on the base substrate partially overlaps with an orthographic projection of one third data connection line 55 on the base substrate. An average width of the second wire section 542 is greater than an average width of the first wire section 541 and an average width of the third wire section 543. In some examples, an average width of the second data connection line 54 may range from 6 to 10 microns. A distance between two adjacent second data connection lines 54 may range from 8 to 12 microns. For example, the average width of the second data connection lines 54 may be about 8.6 microns, and the distance between two adjacent second data connection lines 54 may be about 10 microns. A second wire section 542 of a second data connection line 54 in the second region 302 may have a hollow pattern. An orthographic projection of the hollow pattern on the base substrate may be located in the second groove defined by the third boundary 3121 and the fourth boundary 3122. The hollow pattern may include multiple holes 5420. The multiple holes 5420 are disposed in sequence along an extending direction of the second data connection line 54 in a row. Shapes and sizes of the multiple holes 5420 may be the same or different. For example, the multiple holes 5420 may all be circular or elliptical. However, arrangements, shapes and sizes of the multiple holes are not defined in the present embodiment. The hollow pattern provided on the second data connection line 54 may relieve a stress accumulated on the second data connection line 54 during bending, which is beneficial to releasing the stress when the second data connection line 54 is being bent, reducing a breakage risk of the second data connection line 54, thereby improving a bending effect.

In some exemplary embodiments, as shown in FIG. 2, in a plane parallel to the display substrate, average widths of the multiple first data lead wires 51, the multiple second data lead wires 52, the multiple fourth data connection lines 56 and the multiple fifth data connection lines 57 may be the same, and an average width of the multiple first data connection lines 53 and an average width of the multiple third data connection lines 55 may be the same. An average width of any first data connection line 53 may be greater than an average width of the first wire section 541 of one second data connection line 54, and an average width of the first wire section 541 of the second data connection line 54 may be greater than an average width of the first data lead wire 51. However, this is not limited in the present embodiment.

In the present disclosure, a "width" refers to a dimension along an extending direction perpendicular to a data connection line. A "length" refers to a dimension along an extending direction of a data connection line.

In some exemplary embodiments, as shown in FIG. 2, an inorganic insulator layer 15 has a first edge 151 and a second edge 152 in the bending region 300 in a plane parallel to the display substrate. A hollow region of the inorganic insulator layer 15 is formed between the first edge 151 and the second edge 152. The first edge 151 of the inorganic insulator layer 15 is located in the first region 301 of the bending region 300, and the second edge 152 of the inorganic insulator layer 15 is located in the third region 303 of the bending region 300. Along the extending direction of the data connection lines, a distance between the first edge 151 and an edge of the display region close to the bending region 300 is smaller than a distance between the second edge 152 and the edge of the display region close to the bending region 300.

In some exemplary embodiments, as shown in FIG. 2, the first edge 151 of the inorganic insulator layer 15 directly contacts with the multiple first data connection lines 53 and covers edges of the multiple first data connection lines 53 close to the display region. The first edge 151 of the inorganic insulator layer 15 has a first wave structure including multiple first notches 153 disposed at intervals. The multiple first notches 153 correspond to the multiple first data connection lines 53 one by one, and an orthographic projection of one first notch 153 on the base substrate is located in an orthographic projection of a corresponding first data connection line 53 on the base substrate. An orthographic projection of the first wire section 541 of one second data connection line 54 on the base substrate may cover an orthographic projection of a first notch 153 on the base substrate. The first notch 153 in the first wave structure may be composed of multiple arcs, or of multiple straight lines, or of multiple arcs and multiple straight lines, which is not limited in the present disclosure. As shown in FIG. 2, the first notch 153 may be of a shape of ∩. However, the present embodiment is not limited to this, for example, the first notch may be of a shape of ⊓. In some examples, shapes and sizes of the multiple first notches 153 may be the same. In this exemplary embodiment, by disposing the first wave structure at the first edge 151 of the inorganic insulator layer 15 in the bending region 300, a bending stress acted on the inorganic insulator layer 15 during the bending can be dispersed, stress concentration can be avoided, and a risk of breakage of the inorganic insulator layer 15 can be reduced, thereby improving a bending effect.

In some exemplary embodiments, as shown in FIG. 2, the second edge 152 of the inorganic insulator layer 15 directly contacts with the multiple third data connection lines 55 and covers edges of the multiple third data connection lines 55 away from the display region. The second edge 152 of the inorganic insulator layer 15 has a second wave structure including multiple second notches 154 disposed at intervals. The multiple second notches 154 face the display region. The multiple second notches 154 correspond to the multiple third data connection lines 55 one by one, and an orthographic projection of one second notch 154 on the base substrate is located in an orthographic projection of a corresponding third data connection line 55 on the base substrate. An orthographic projection of a third wire section 543 of one second data connection line 54 on the base substrate may cover an orthographic projection of one second notch 154 on the base substrate. The second notch 154 in the second wave structure may be composed of multiple arcs, or of multiple straight lines, or of multiple arcs and multiple straight lines, which is not limited in the present disclosure. As shown in FIG. 2, the second notch 154 may be of a shape of ∪. However, this is not limited in the present embodiment. For example, the second notch 154 may be of a shape of ⊔. In some examples, shapes and sizes of the multiple second notches 154 may be the same. The shapes and sizes of the multiple second notches 154 and the multiple first notches 153 may be the same or different. In this exemplary embodiment, a bending stress acted on the inorganic insulator layer 15 during the bending can be dispersed, stress concentration can be avoided, and a risk of breakage of the inorganic insulator layer 15 can be reduced by disposing the second wave structure at the second edge 152 of the inorganic insulator layer 15 in the bending region 300, thereby improving a bending effect.

In some exemplary embodiments, as shown in FIG. 2, along a direction from the bending region 300 to the display region, a first distance L1 between the first edge 151 of the inorganic insulator layer 15 and an edge of a first data connection line 53 covered by the first edge 151 may be greater than or equal to 5 microns (μm). Along a direction from the display region to the bending region 300, a second distance L2 between the second edge 152 of the inorganic insulator layer 15 and an edge of a third data connection line 55 covered by the second edge 152 may be greater than or equal to 5 μm. In some examples, the second distance L2 and the first distance L1 may be the same or different. However, this is not limited in the present embodiment.

In some exemplary embodiments, as shown in FIG. 3, in a plane perpendicular to the display substrate, the display region 100 includes a base substrate 10, a drive structure layer disposed on the base substrate 10, and an inorganic insulator layer 15, a first planarization layer 16, a metal conductive layer and a second planarization layer 17 which are sequentially disposed on the drive structure layer, and includes a light-emitting element disposed on the second planarization layer 17, and an encapsulation layer 42 covering the light-emitting element. The first planarization layer 16 is a first insulator layer in the present embodiment, and the first insulator layer is an organic insulator layer. The drive structure layer of the display region 100 includes multiple transistors and at least one storage capacitor which form a pixel drive circuit, wherein the pixel drive circuit may have a design of 2T1C (i.e., two thin film transistors and one capacitor), 3T1C (i.e., three thin film transistors and one capacitor) or 7T1C (i.e., seven thin film transistors and one capacitor). In FIG. 3, one first transistor and one first storage capacitor are taken as an example. The first transistor may be a drive transistor. The drive structure layer of the display region 100 may include a buffer layer 11 disposed on the base substrate 10, an active layer disposed on the buffer layer 11, a first gate insulator layer 12 covering the active layer, a first gate metal layer disposed on the first gate insulator layer 12, a second gate insulator layer 13 covering the first gate metal layer, a second gate metal layer disposed on the second gate insulator layer 13, an interlayer dielectric layer 14 covering the second gate metal layer, and a source and drain metal layer disposed on the interlayer dielectric layer 14. The active layer may at least include a first active layer 21, the first gate metal layer may at least include a first gate electrode 22 and a first capacitor electrode 25, the second gate metal layer may at least include a second capacitor electrode 26, and the source and drain metal layer may at least include a first source electrode 23 and a first drain electrode 24. The first active layer 21, the first gate electrode 22, the first source electrode 23 and the first drain electrode 24 form a first transistor, and the first capacitor electrode and the second capacitor electrode form a first storage capacitor. The metal conductive layer includes at least a connection electrode 27. The connection electrode 27 is connected to the first drain electrode 24 of the first transistor through via holes formed on the inorganic insulator layer 15 and the first planarization layer 16. In some embodiments, the source and drain metal layer is called a first source and drain metal layer (SD1), and the metal conductive layer is called a second source and drain metal layer (SD2). The light emitting element may include an anode 31, a pixel definition layer 34, an organic light emitting layer 32, and a cathode 33. The anode 31 is connected to the connection electrode 27 through via holes formed on the second planarization layer 17, so that the anode 31 is connected to the first drain electrode 24 of the first transistor. A side of a pixel definition layer 34 away from the base substrate 10 is provided with a post spacer layer 41. In some examples, the encapsulation layer 42 may include an inorganic material layer, an organic material layer, and an inorganic material layer sequentially stacked. However, this is not limited in the present embodiment.

In some exemplary embodiments, as shown in FIGS. 3 and 4, in a plane perpendicular to the display substrate, the first region 301 of the bending region 300 includes a base substrate 10, and a buffer layer 11, a first gate insulator layer 12, a first data lead wire layer, a second gate insulator layer 13, a second data lead wire layer, an interlayer dielectric layer 14, a second wiring layer, an inorganic insulator layer 15, a first planarization layer 16, a third wiring layer, a second planarization layer 17, a pixel definition layer 34 and a post spacer layer 41 which are sequentially disposed on the base substrate 10. The first data lead wire layer includes multiple first data lead wires (not shown in FIG. 3), and the second data lead wire layer includes multiple second data lead wires (one second data lead wire 52 illustrated in FIG. 3). The second wiring layer includes multiple first data connection lines (one first data connection line 53 is illustrated in FIG. 3). The third wiring layer includes multiple second data connection lines (one second data connection line 54 is illustrated in FIG. 3). An orthographic projection of the first data connection line 53 on the base substrate 10 partially overlaps with an orthographic projection of one first data lead wire or one second data lead wire 52 on the base substrate, and an orthographic projection of the second data connection line 54 on the base substrate 10 partially overlaps with an orthographic projection of one first data connection line 53 on the base substrate 10. The first edge 151 of the inorganic insulator layer 15 covers an edge of the first data connection line 53 close to the display region 100. The first data connection line 53 is connected to the second data lead wire 52 through via holes formed on the interlayer dielectric layer 14, or connected to the first data lead wire through via holes disposed on the interlayer dielectric layer 14 and the second gate insulator layer 13. The second data connection line 54 is connected to the first data connection line 53 through a first opening formed on the first planarization layer 16. An orthographic projection of the first planarization layer 16 on the base substrate 10 overlaps with an orthographic projection of the edge of the first data connection line 53 close to the display region 100 on the base substrate 10. The first planarization layer 16 directly contacts with at least part of the first data connection line 53.

In some exemplary embodiments, as shown in FIG. 3, in a plane perpendicular to the display substrate, the second region 302 of the bending region 300 includes a base substrate 10, and a composite insulator layer, a first planarization layer 16, a third wiring layer, a second planarization layer 17, a pixel definition layer 34 and a post spacer layer 41 which are sequentially disposed on the base substrate 10. The composite insulator layer includes a buffer layer 11, a first gate insulator layer 12, a second gate insulator layer 13, and an interlayer dielectric layer 14 which are sequentially disposed on the base substrate 10. The composite insulator layer of the second region 302 is provided with a first groove 311 and a second groove 312. The interlayer dielectric layer 14 in the first groove 311 is etched off, and the interlayer dielectric layer 14, the second gate insulator layer 13, the first gate insulator layer 12 and the buffer layer 11 in the second groove 312 are all etched off. An orthographic projection of the second groove 312 on the base substrate 10 is located in an orthographic projection of the first groove 311 on the base substrate 10. A first planarization layer 16, a third wiring layer, a second planarization layer 17, a pixel definition layer 34 and a post spacer layer 41 are sequentially disposed in the first groove 311 and the second groove 312. The third wiring layer includes multiple second data connection lines (one second data connection line 54 is illustrated in FIG. 3).

In some exemplary embodiments, as shown in FIG. 3, in a plane perpendicular to the display substrate, the third region 303 of the bending region 300 includes a base substrate 10 and a buffer layer 11, a first gate insulator layer 12, a first data lead wire layer, a second gate insulator layer 13, a second data lead wire layer, an interlayer dielectric layer 14, a second wiring layer, an inorganic insulator layer 15, a first planarization layer 16, a third wiring layer, a second planarization layer 17, a pixel definition layer 34, and a post spacer layer 41 which are sequentially disposed on the base substrate 10. The first data lead wire layer includes multiple fourth data connection lines (not shown in FIG. 3), and the second data lead wire layer includes multiple fifth data connection lines (one fifth data connection line 57 is illustrated in FIG. 3). The second wiring layer includes multiple third data connection lines (one third data connection line 55 is illustrated in FIG. 3). The third wiring layer includes multiple second data connection lines (one second data connection line 54 is illustrated in FIG. 3). An orthographic projection of one third data connection line 55 on the base substrate 10 partially overlaps with an orthographic projection of one fourth data connection line or one fifth data connection line 57 on the base substrate, and an orthographic projection of one second data connection line 54 on the base substrate 10 partially overlaps with an orthographic projection of one third data connection line 55 on the base substrate 10. The second edge 152 of the inorganic insulator layer 15 covers an edge of the third data connection line 55 away from the display region 100. A third data connection line 55 is connected to the fifth data connection line 57 through via holes formed on the interlayer dielectric layer 14, or connected to the fourth data connection line 56 through via holes formed on the interlayer dielectric layer 14 and the second gate insulator layer 13. A second data connection line 54 is connected to the third data connection line 55 through a second opening formed on the first planarization layer 16.

In some exemplary embodiments, structures in the first region 301 and the third region 303 of the bending region 300 are symmetrical with each other, and the symmetry axis is perpendicular to an extending direction of the data connection lines. However, this is not limited in the present embodiment. In some examples, a structure in the third region of the bending region 300 may be different or partially the same as a structure in the first region.

A structure of a display substrate according to the present disclosure is described below by an example of a preparation process of a display substrate. The "patterning process" mentioned in the present disclosure includes processes, such as film layer deposition, photoresist coating, mask exposure, development, etching, and photoresist stripping. The deposition may be selected as any one or more of sputtering, evaporation and chemical vapor deposition, the coating may be selected as any one or more of spraying and spin coating, and etching may be selected as any one or more of dry etching and wet etching. A "thin film" refers to a layer of thin film manufactured from a certain material on a base substrate by using deposition or coating process. If the "thin film" does not need a patterning process during the whole manufacturing process, the "thin film" may also be called a "layer". When the "thin film" needs a patterning process during the whole manufacturing process, it is called "thin film" before the patterning process and called "layer" after the patterning process. The "layer" after the patterning process contains at least one "pattern".

In the present disclosure, "A and B are disposed in a same layer" means that A and B are formed at the same time by a same patterning process. "Same layer" does not always mean that a thickness of a layer or a height of a layer are the same in a cross-sectional view. "An orthographic projection of A includes an orthographic projection of B" means that an orthographic projection of B falls within a range of an orthographic projection of A, or the orthographic projection of A covers the orthographic projection of B.

In some exemplary embodiments, the process for manufacturing the display substrate of the present embodiment may include the following steps (1) to (12). FIGS. 5 to 7, 9 to 10, 12 and 14 to 19 are schematic diagrams of a cross-section along the P-P direction in FIG. 1.

(1) Preparing a flexible base substrate on a glass carrier plate.

In some exemplary embodiments, the flexible base substrate 10 includes a first flexible material layer, a first inorganic material layer, a semiconductor layer, a second flexible material layer and a second inorganic material layer stacked on the glass carrier plate 1. The first flexible material layer and the second flexible material layer may be made of materials such as polyimide (PI), polyethylene terephthalate (PET) or a surface-treated polymer soft film. The first inorganic material layer and the second inorganic material layer may be made of materials such as silicon nitride (SiNx) or silicon oxide (SiOx), which are used to improve a water and oxygen resistance of the base substrate. The first inorganic material layer and the second inorganic material layer are also called barrier layers. Material of the semiconductor layer may be amorphous silicon (a-Si).

Figure 5:
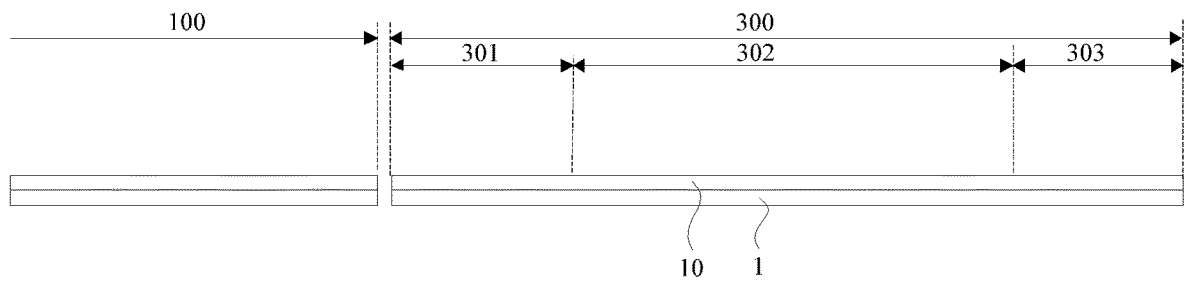
FIG. 5 is a schematic diagram of a display substrate after a base substrate is formed in at least one embodiment of the present disclosure.

In some exemplary embodiments, taking a laminated structure PI1/Barrier1/a-si/PI2/Barrier2 as an example, the preparation process may include: coating a layer of polyimide on the glass carrier plate 1 first, and forming a first flexible layer (PI1) after curing to form a film; subsequently, depositing a layer of barrier thin film on the first flexible layer to form a first barrier layer (Barrier 1) covering the first flexible layer; then depositing a layer of amorphous silicon thin film on the first barrier layer to form an amorphous silicon (a-si) layer covering the first barrier layer; then coating a layer of polyimide on the amorphous silicon layer, and forming a second flexible layer (PI2) after curing to form a film; then depositing a layer of barrier thin film on the second flexible layer to form a second barrier (Barrier 2) layer covering the second flexible layer, to complete the preparation of the base substrate 10, as shown in FIG. 5. After this process, both the display region 100 and the bending region 300 include the base substrate 10.

(2) Preparing a pattern of an active layer on the base substrate.

Figure 6:
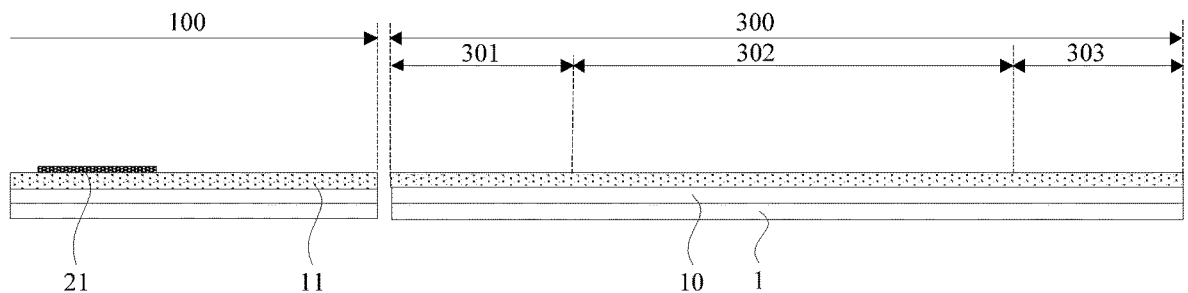
FIG. 6 is a schematic diagram of a display substrate after a pattern of an active layer is formed in at least one embodiment of the present disclosure.

In some exemplary embodiments, a first insulator thin film and an active layer thin film are sequentially deposited on the base substrate 10, and the active layer thin film is patterned by a patterning process to form a buffer layer 11 covering the entire base substrate 10 and a pattern of an active layer disposed on the buffer layer 11. As shown in FIG. 6, the pattern of the active layer is formed in the display region 100 and at least includes a first active layer 21. After the patterning process, the bending region 300 includes the buffer layer 11 disposed on the base substrate 10.

(3) Preparing patterns of a first gate metal layer and a first data lead wire layer on the base substrate.

Figure 7:
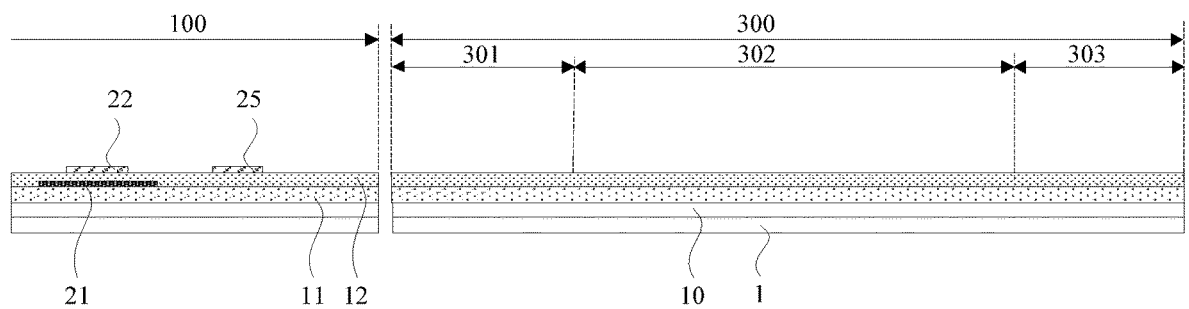
FIG. 7 is a schematic diagram of a display substrate after patterns of a first gate metal layer and a first data lead wire layer are formed in at least one embodiment of the present disclosure.

In some exemplary embodiments, a second insulator thin film and a first metal thin film are sequentially deposited on the base substrate 10 where the above structures are formed, and the first metal thin film is patterned by a patterning process to form a first gate insulator layer 12 covering the pattern of the active layer, and patterns of a first gate metal layer and a first data lead wire layer disposed on the first gate insulator layer 12. As shown in FIG. 7, the pattern of the first gate metal layer is formed in the display region 100, and at least includes a first gate electrode 22, a first capacitor electrode 25, multiple gate lines (not shown) and multiple gate lead wires (not shown). The pattern of the first data lead wire layer is formed in the bending region 300, and at least includes multiple first data lead wires (not shown) and multiple fourth data connection lines (not shown), wherein the multiple first data lead wires are configured to be connected to data lines subsequently formed in the display region 100, and the multiple fourth data connection lines are configured to be connected to third data connection lines subsequently formed in the bending region 300. In some examples, extending directions of the multiple first data lead wires and the multiple fourth data connection lines are parallel to each other.

After the patterning process, the bending region 300 includes the buffer layer 11, the first gate insulator layer 12 and the first data lead wire layer which are stacked on the base substrate 10.

(4) Preparing patterns of a second gate metal layer and a second data lead wire layer on the base substrate.

Figure 8:
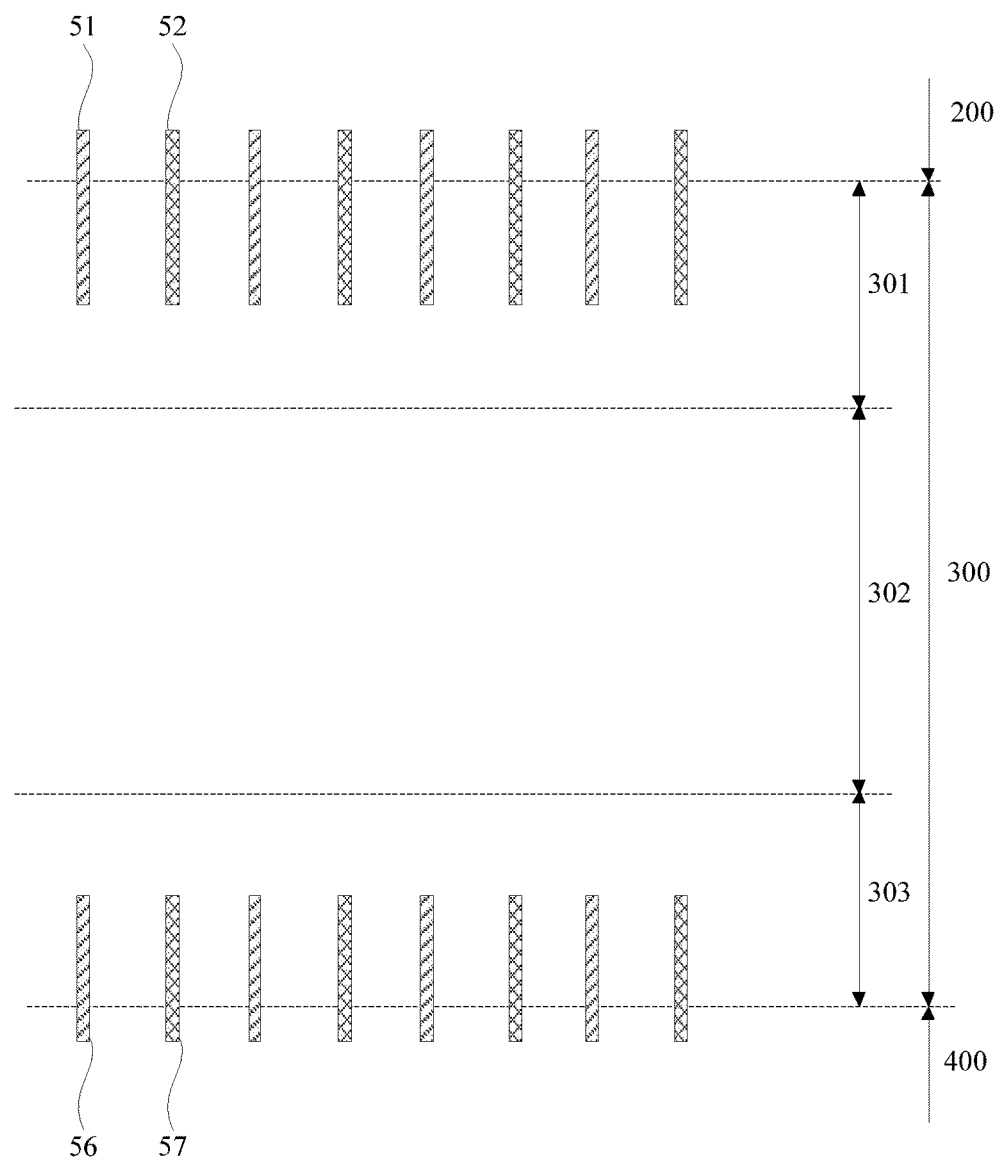
FIG. 8 is a plan view of a bending region after a pattern of a second data lead wire layer is formed in at least one embodiment of the present disclosure.
Figure 9:
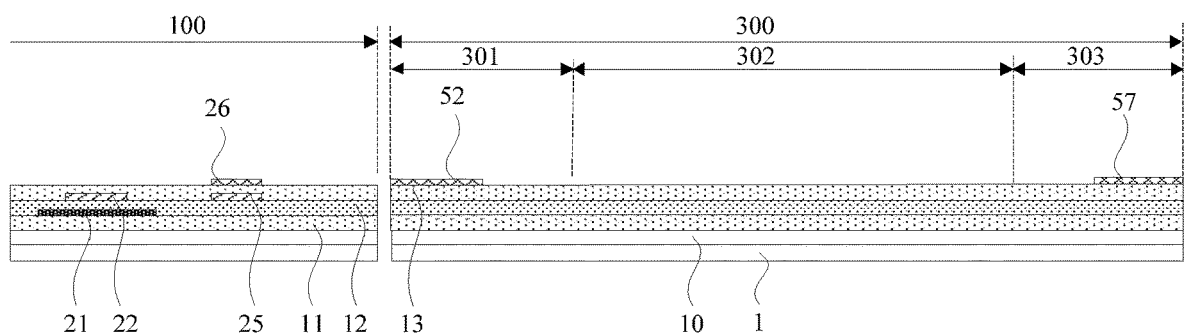
FIG. 9 is a schematic diagram of a display substrate after patterns of a second gate metal layer and a second data lead wire layer are formed in at least one embodiment of the present disclosure.

In some exemplary embodiments, a third insulator thin film and a second metal thin film are sequentially deposited on the base substrate 10 where the above structures are formed, and the second metal thin film is patterned by a patterning process to form a second gate insulator layer 13 covering the pattern of the first gate metal layer, the pattern of the first data lead wire layer and the first gate insulator layer 12, and a pattern of a second gate metal layer and a pattern of a second data lead wire layer disposed on the second gate insulator layer 13. As shown in FIG. 9, pattern of the second gate metal layer is formed in the display region 100, and at least includes a second capacitor electrode 26, wherein position of the second capacitor electrode 26 corresponds to a position of the first capacitor electrode 25. The pattern of the second data lead wire layer is formed in the bending region 300, and at least includes multiple second data lead wires 52 and multiple fifth data connection lines 57, wherein the multiple second data lead wires 52 are configured to be connected to the data lines subsequently formed in the display region 100, and the multiple fifth data connection lines 57 are configured to be connected to the third data connection lines subsequently formed in the bending region 300. As shown in FIG. 8, an orthographic projection of the first data lead wire layer on the base substrate 10 does not overlap with an orthographic projection of the second data lead wire layer on the base substrate 10. Orthographic projections of the multiple first data lead wires 51 and the multiple second data lead wires 52 are disposed at intervals on the base substrate 10, and orthographic projections of the multiple fourth data connection lines 56 and the multiple fifth data connection lines 57 are disposed at intervals on the base substrate 10. In some examples, the extending direction of the multiple second data lead wires and the multiple fifth data connection lines are parallel to the extending direction of the multiple first data lead wires and the multiple fourth data connection lines. In this exemplary embodiment, the multiple data lead wires are disposed in different layers, which may reduce distances between adjacent data lead wires, reduce transmission interferences of the adjacent data lead wires and improve the signal transmission performance.

After the patterning process, the bending region 300 includes a buffer layer 11, a first gate insulator layer 12, a first data lead wire layer, a second gate insulator layer 13 and a second data lead wire layer which are stacked on the base substrate 10.

(5) Preparing a pattern of an interlayer dielectric layer on the base substrate.

Figure 10:
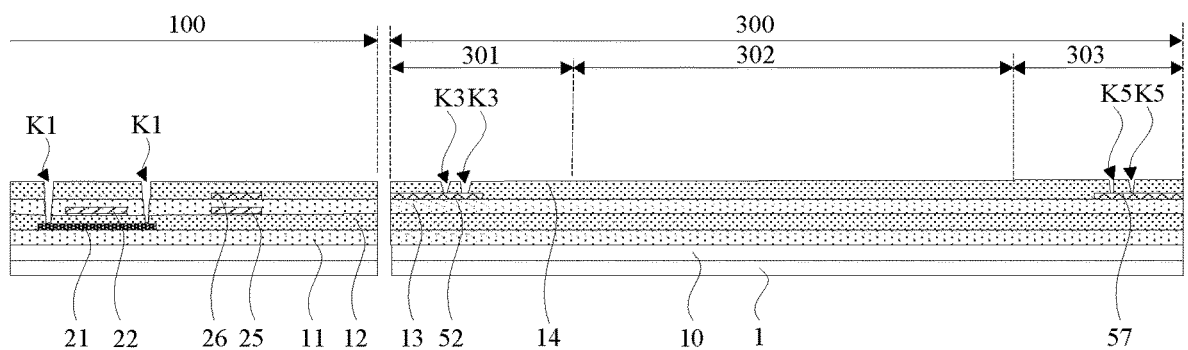
FIG. 10 is a schematic diagram of a display substrate after a pattern of an interlayer dielectric layer is formed in at least one embodiment of the present disclosure.

In some exemplary embodiments, a fourth insulator thin film is deposited on the base substrate 10 where the above structures are formed, and the fourth insulator thin film is patterned by a patterning process to form a pattern of an interlayer dielectric layer 14 covering patterns of the second gate metal layer and the second data lead wire layer. As shown in FIG. 10, the interlayer dielectric layer 14 of the display region 100 is provided with at least two first via holes K1, wherein the interlayer dielectric layer 14, the second gate insulator layer 13 and the first gate insulator layer 12 in the two first via holes K1 are etched off to expose a surface of the first active layer 21. The interlayer dielectric layer 14 in the first region 301 of the bending region 300 is provided with multiple second via holes (not shown in the figure) and multiple third via holes K3. The interlayer dielectric layer 14 and the second gate insulator layer 13 in any second via hole are etched off to expose a surface of one first data lead wire, and the interlayer dielectric layer 14 in any third via hole K3 is etched off to expose a surface of one second data lead wire 52. The interlayer dielectric layer 14 in the third region 303 of the bending region 300 is provided with multiple fourth via holes (not shown in the figure) and multiple fifth via holes K5. The interlayer dielectric layer 14 and the second gate insulator layer 13 in any fourth via hole are etched off to expose a surface of one fourth data connection line, and the interlayer dielectric layer 14 in any fifth via hole K5 is etched off to expose a surface of one fifth data connection line 57.

After the patterning process, the bending region 300 includes a buffer layer 11, a first gate insulator layer 12, a first data lead wire layer, a second gate insulator layer 13, a second data lead wire layer and an interlayer dielectric layer 14 which are stacked on the base substrate 10.

(6) Preparing patterns of a source and drain metal layer and a second wiring layer on the base substrate.

Figure 11:
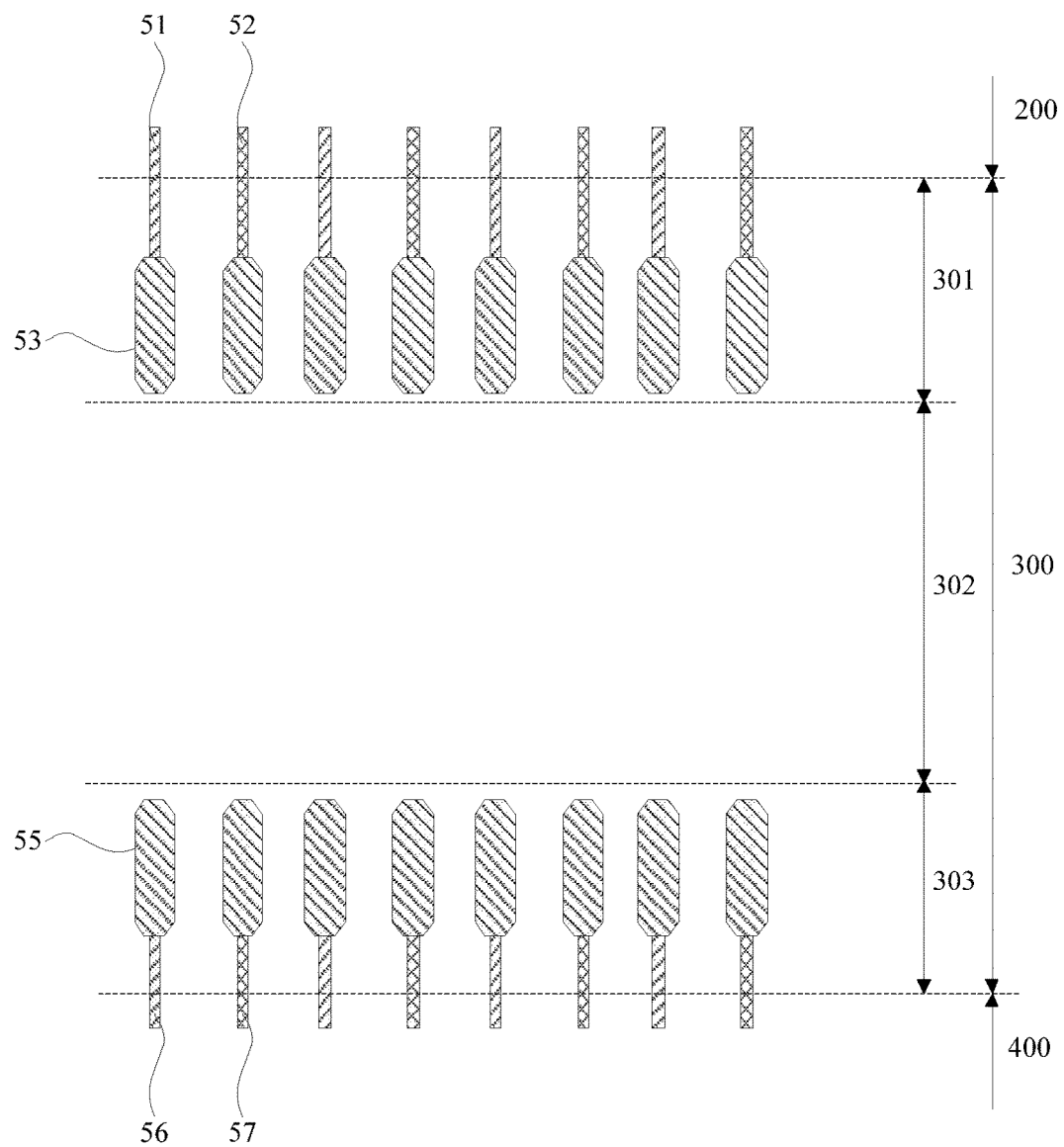
FIG. 11 is a plan view of a bending region after a pattern of a second wiring layer is formed in at least one embodiment of the present disclosure.
Figure 12:
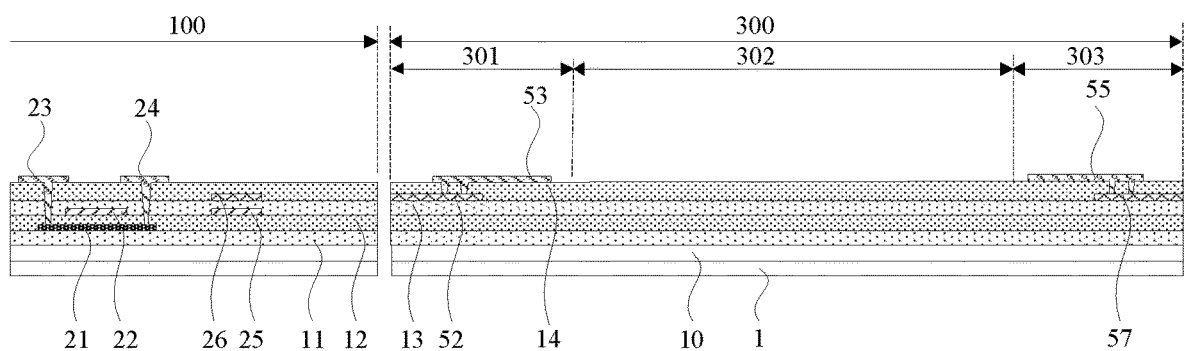
FIG. 12 is a schematic diagram of a display substrate after patterns of a source and drain metal layer and a second wiring layer are formed in at least one embodiment of the present disclosure.

In some exemplary embodiments, a third metal thin film is deposited on the base substrate 10 where the above structures are formed, and the third metal thin film is patterned by a patterning process to form a pattern of a source and drain metal layer and a pattern of a second wiring layer on the interlayer dielectric layer 14. As shown in FIG. 12, the pattern of the source and drain metal layer is formed in the display region 100, and at least includes patterns of a first source electrode 23, a first drain electrode 24, multiple data lines (not shown), and power supply lines (for example, VDD and VSS). The first source electrode 23 and the first drain electrode 24 are connected to the first active layer 21 through the first via holes K1. As shown in FIG. 11, the pattern of the second wiring layer is formed in the bending region 300, and at least includes multiple first data connection lines 53 and multiple third data connection lines 55. The multiple first data connection lines 53 are located in the first region 301, and the multiple third data connection lines 55 are located in the third region 303. Extending directions of the multiple first data connection lines 53 and the multiple third data connection lines 55 are parallel to each other. In some examples, the extending directions of the multiple first data connection lines 53 and the multiple third data connection lines 55 are parallel to an extending direction of the data lead wires. As shown in FIG. 10 and FIG. 12, any first data connection line 53 may be connected to a first data lead wire through at least one second via hole (e.g., two second via holes), or may be connected to a second data lead wire through at least one third via hole K3 (e.g., two third via holes K3). Any third data connection line 55 may be connected to the fourth data connection line through at least one fourth via hole (e.g., two fourth via holes), or may be connected to the fifth data connection line 57 through at least one fifth via hole K5 (e.g., two fifth via holes K5). In this exemplary embodiment, the first data connection line may be connected to one data lead wire through multiple via holes, thereby increasing a contact area between the first data connection line and the data lead wire, thereby improving stability of the signal transmission.

To this point, a drive structure layer of the display region 100 is prepared on the base substrate 10, as shown in FIG. 12. In the drive structure layer of the display region 100, the first active layer 21, the first gate electrode 22, the first source electrode 23 and the first drain electrode 24 form a first transistor, and the first capacitor electrode 25 and the second capacitor electrode 26 form a first storage capacitor.

In some exemplary embodiments, the buffer layer 11, the first gate insulator layer 12, the second gate insulator layer 13, and the interlayer dielectric layer 14 may be made of any one or more of silicon oxide (SiOx), silicon nitride (SiNx), and silicon oxynitride (SiON), and may be a single layer, multiple layers, or a composite layer. The buffer layer 11 may be used to improve a water and oxygen resistance of the base substrate 10. The first metal thin film, the second metal thin film and the third metal thin film may be made of metal materials, such as any one or more of silver (Ag), copper (Cu), aluminum (Al), titanium (Ti) and molybdenum (Mo), or an alloy material of the above metals, such as AlNd alloy or MoNb alloy, which may have a single-layer structure or a multilayer composite structure, such as Ti/Al/Ti, etc. The active layer thin film may be made of one or more materials such as amorphous indium gallium zinc Oxide (a-IGZO), zinc oxynitride (ZnON), indium zinc tin oxide (IZTO), amorphous silicon (a-Si), polysilicon (p-Si), hexathiophene, polythiophene, or the like, that is, the present disclosure is applicable to transistors manufactured based on an oxide technology, a silicon technology and an organic technology.

(7) Preparing a pattern of an inorganic insulator layer on the base substrate.

In the present embodiment, an inorganic insulator layer 15 is also called a PVX (Passivation) layer. In some exemplary embodiment, the inorganic insulator layer 15 may be made of any one or more of silicon oxide (SiOx), silicon nitride (SiNx) and silicon oxynitride (SiON), and may be a single layer, multiple layers or a composite layer.

Figure 14:
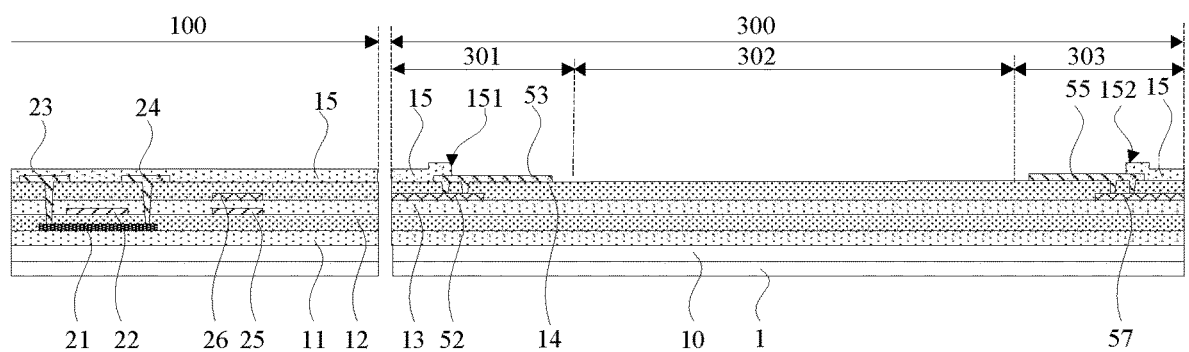
FIG. 14 is a schematic diagram of a display substrate after a pattern of an inorganic insulator layer is formed in at least one embodiment of the present disclosure.

In some exemplary embodiments, a fifth insulator thin film is deposited on the base substrate 10 where the above structures are formed, and the fifth insulator thin film is patterned by a patterning process to form a pattern of the inorganic insulator layer 15. As shown in FIG. 14, the inorganic insulator layer 15 covers the source and drain metal layer and the interlayer dielectric layer 14 of the display region 100. The inorganic insulator layer 15 has a first edge 151 and a second edge 152 in the bending region 300, wherein the inorganic insulator layer 15 between the first edge 151 and the second edge 152 is etched off to form a hollow region of the inorganic insulator layer 15. The first edge 151 of the inorganic insulator layer 15 is located in the first region 301, and the second edge 152 is located in the third region 303. The first edge 151 of the inorganic insulator layer 15 covers an edge of the first data connection line 53 close to the display region 100. The second edge 152 of the inorganic insulator layer 15 covers an edge of the third data connection line 55 away from the display region 100.

Figure 13:
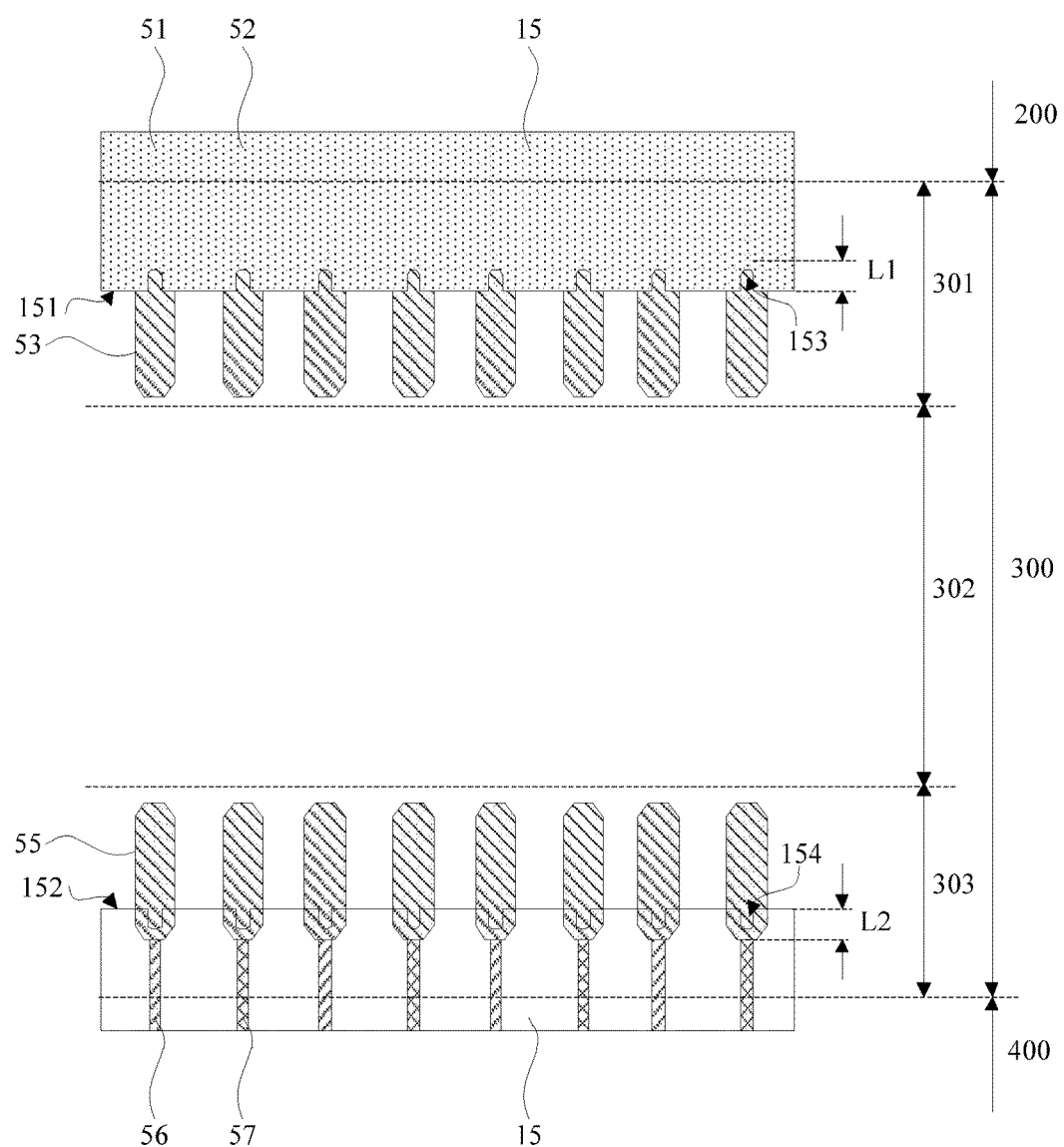
FIG. 13 is a plan view of a bending region after a pattern of an inorganic insulator layer is formed in at least one embodiment of the present disclosure.

In some exemplary embodiments, as shown in FIG. 13, the first edge 151 of the inorganic insulator layer 15 has a first wave structure, which includes multiple first notches 153 disposed at intervals. The multiple first notches 153 correspond to the multiple first data connection lines 53 one by one, and an orthographic projection of any first notch 153 on the base substrate 10 is located with an orthographic projection of a corresponding first data connection line 53 on the base substrate 10. As shown in FIG. 13, the first notch 153 may be of a shape of ∩. The second edge 152 of the inorganic insulator layer 15 has a second wave structure, which includes multiple second notches 154 disposed at intervals. The multiple second notches 154 correspond to the multiple third data connection lines 55 one by one, and an orthographic projection of any second notch 154 on the base substrate 10 is located in an orthographic projection of a corresponding third data connection line 55 on the base substrate 10. As shown in FIG. 13, the second notch 154 may be of a shape of ∪.

In some exemplary embodiments, as shown in FIG. 13, in a direction away from the display region 100, a first distance between the first edge 151 of the inorganic insulator layer 15 and an edge of the first data connection line 53 covered by the first edge 151 is L1, and a second distance between the second edge 152 of the inorganic insulator layer 15 and an edge of the third data connection line 55 covered by the second edge 152 is L2. The first distance L1 may be equal to the second distance L2 and greater than or equal to 5 μm. In some examples, a distance between an edge of the first notch 153 of the first edge 151 of the inorganic insulator layer 15 close to the display region and the edge of the first data connection line 53 covered by the first edge 151 may be greater than or equal to 1.5 μm. However, this is not limited in the present embodiment.

In this exemplary embodiment, the inorganic insulator layer 15 covers edges of the second wiring layer close to the display region and away from the display region, so that the second data lead wire layer in the bending region is covered by the interlayer dielectric layer 14 and the inorganic insulator layer 15, which effectively protect the second data lead wire layer. When the first edge of the inorganic insulation layer in the bending region does not overlap with the second wiring layer, a thickness of the interlayer dielectric layer will be thinned due to overetching in an etching process of the inorganic insulation layer. In a bending process, microcracks will easily form in the thinned interlayer dielectric layer due to stress concentration. In a long-term high-temperature and high-humidity reliable environment, water vapor will penetrate into the microcracks, causing reliable water and oxygen corrosion to the second data lead wires, resulting in poor bright lines in the display region. Compared with this, in this exemplary embodiment, the first edge of the inorganic insulator layer and an edge of the second wiring layer in the bending region are disposed to overlap with each other, which may avoid the water vapor infiltration caused by the thinning of the interlayer dielectric layer covering the second data lead wire layer during the etching process of the inorganic insulator layer, thereby improving a corrosion resistance of the display substrate and further prolonging a service life of the display substrate in extreme environments.

(8) Patterning a buffer layer to an interlayer dielectric layer in the bending region by a patterning process, and forming a first groove and a second groove in the bending region.

Figure 15:
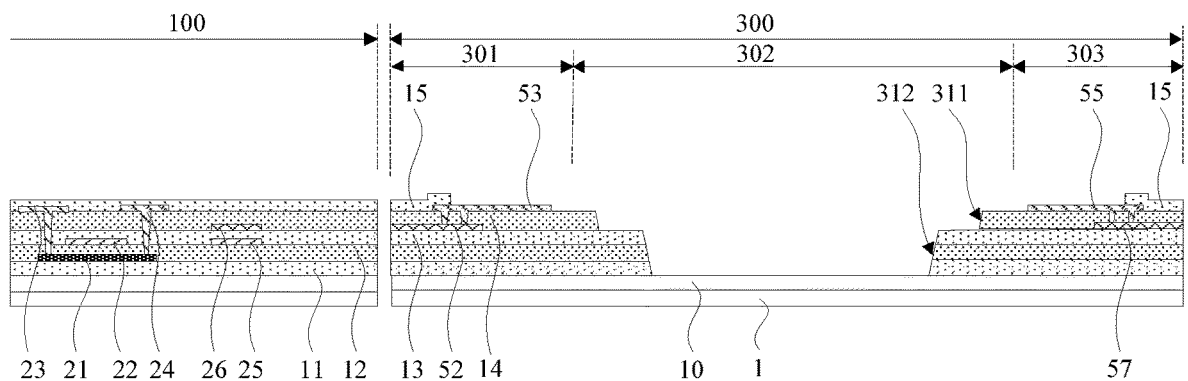
FIG. 15 is a schematic diagram of a display substrate after processes of EBA and EBB in at least one embodiment of the present disclosure.

In some exemplary embodiments, on the base substrate 10 where the above structures are formed, the interlayer dielectric layer 14 of the second region 302 of the bending region 300 is etched through an EBA MASK (Etch Bending A MASK, abbreviated as EBA MASK) to form a first groove 311, wherein the interlayer dielectric layer 14 in the first groove 311 is etched off to expose a surface of the second gate insulator layer 13. Then, the second gate insulator layer 13, the first gate insulator layer 12 and the buffer layer 11 in the first groove 311 in the second region 302 of the bending region 300 are etched through an EBB MASK (Etch Bending B MASK, abbreviated as EBB MASK)) to form a second groove 312, wherein the second gate insulator layer 13, the first gate insulator layer 12 and the buffer layer 11 in the second groove 312 are etched off to expose a surface of the base substrate 10. As shown in FIG. 15, an orthographic projection of the first groove 311 on the base substrate 10 covers an orthographic projection of the second groove 312 on the base substrate 10. The EBA MASK and EBB MASK are used to groove the bending region 300, which can reduce a thickness of the bending region 300 and improve a bending effect.

After the patterning process, film layer structures of the display region 100 and the first region 301 and the third region 303 of the bending region 300 have not changed.

(9) Preparing a first planarization layer on the base substrate. The first planarization layer is the first insulator layer of the present embodiment.

Figure 16:
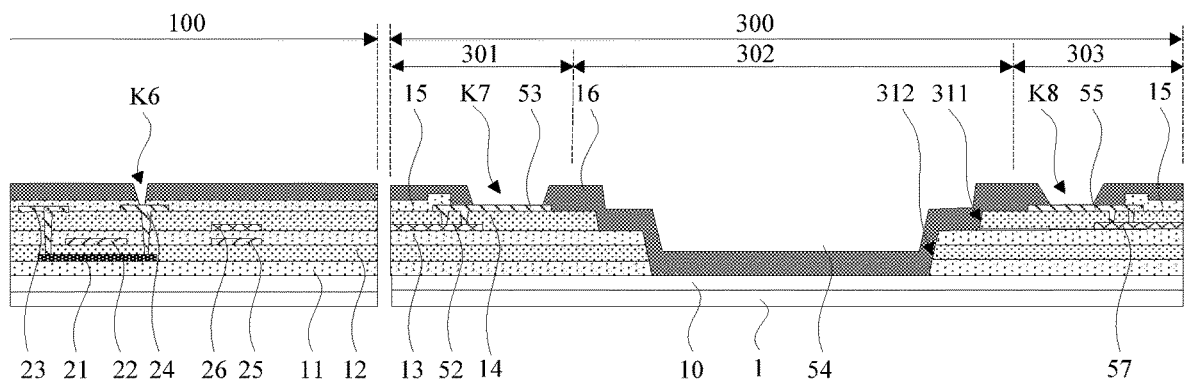
FIG. 16 is a schematic diagram of a display substrate after a pattern of a first planarization layer is formed in at least one embodiment of the present disclosure.

In some exemplary embodiments, a first planarization thin film is coated on the base substrate 10 where the above structures are formed to form a first planarization layer 16 covering the entire base substrate 10, and multiple sixth via holes K6, multiple first openings K7 and multiple second openings K8 are formed on the first planarization layer 16 by a patterning process. As shown in FIG. 16, the multiple sixth via holes K6 are formed in the display region 100, wherein the first planarization layer 16 and the inorganic insulator layer 15 in any sixth via hole K6 are etched off to expose a surface of the first drain electrode 24 of the first transistor. The multiple first openings K7 are formed in the first region 301 of the bending region 300, and the first planarization layer 16 in any first opening K7 is etched off to expose a surface of one first data connection line 53. The multiple second openings K8 are formed in the third region 303 of the bending region 300, wherein the first planarization layer 16 in any second opening K8 is etched off to expose a surface of one third data connection line 55. As shown in FIG. 16, an orthographic projection of any first opening K7 on the base substrate 10 is located in an orthographic projection of the first data connection line 53 on the base substrate 10, and an orthographic projection of any second opening K8 on the base substrate 10 is located in an orthographic projection of the third data connection line 55 on the base substrate 10. In some examples, an orthographic projection of any first opening K7 on the base substrate 10 may not overlap with the first edge 151 of the inorganic insulator layer 15, and an orthographic projection of any second opening K8 on the base substrate 10 may not overlap with the second edge 152 of the inorganic insulator layer 15. However, this is not limited in the present embodiment.

In some exemplary embodiments, the first planarization layer 16 is filled in the second groove 312. The first planarization layer 16 may adjust a thickness of steps formed by the second groove, thereby reducing risks of breakage of the third wiring layer formed subsequently due to an excessive thickness of the steps formed by the second groove. However, this is not limited in the present embodiment. In some examples, the first planarization layer 16 may fill the second groove 312 and the first groove 311.

(10) Preparing patterns of a metal conductive layer and a third wiring layer on the base substrate.

Figure 17:
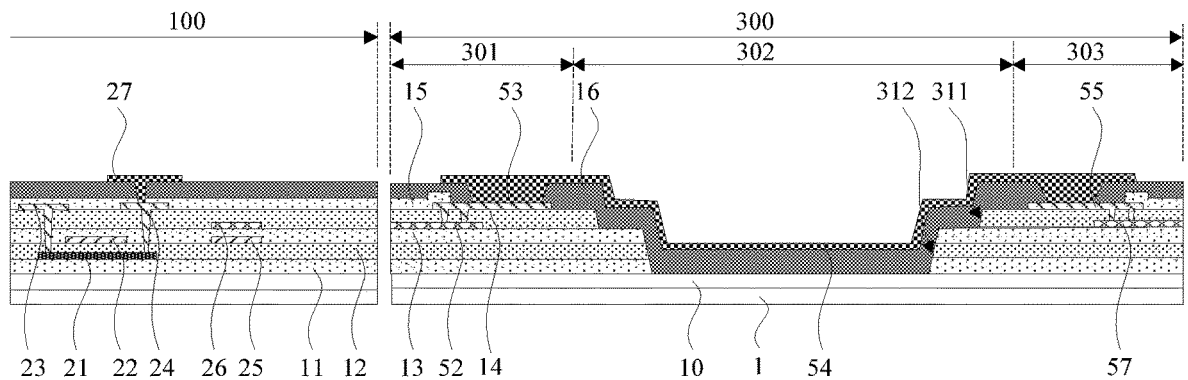
FIG. 17 is a schematic diagram of a display substrate after patterns of a metal conductive layer and a third wiring layer are formed in at least one embodiment of the present disclosure.

In some exemplary embodiments, a fourth metal thin film is deposited on the base substrate 10 where the above structures are formed, and the fourth metal thin film is patterned by a patterning process to form a pattern of a metal conductive layer and a pattern of a third wiring layer on the first planarization layer 16. As shown in FIG. 17, the pattern of the metal conductive layer is formed in the display region 100, and at least includes a connection electrode 27, wherein the connection electrode 27 is connected to the first drain electrode 24 of the first transistor through a sixth via hole. In some examples, the metal conductive layer may further include any one or more of a power supply line, a power lead wire and an auxiliary cathode. However, this is not limited in the present embodiment. The pattern of the third wiring layer is formed in the bending region 300 and includes at least multiple second data connection lines 54. Extending directions of the multiple second data connection lines 54 are parallel to each other. In some examples, extending directions of the multiple second data connection lines 54 and the multiple first data connection lines 53 are parallel to each other. Any second data connection line 54 extends from the first region 301 of the bending region 300 to the third region 303 via the second region 302. The second data connection lines 54 are connected to the first data connection lines 53 in the first region 301 through the first openings K7 and are connected to the third data connection lines 55 in the third region 303 through the second openings K8. In this exemplary embodiment, the first data connection lines 53, the second data connection lines 54 and the third data connection lines 55 are connected in series to realize signal transmission between the first data lead wires 51 and the fourth data connection lines 56, as well as signal transmission between the second data lead wires 52 and the fifth data connection lines 57, thereby realizing signal transmission between the data lines in the display region and the integrated circuit in the bonding region.

(11) Preparing a second planarization layer on the base substrate.

Figure 18:
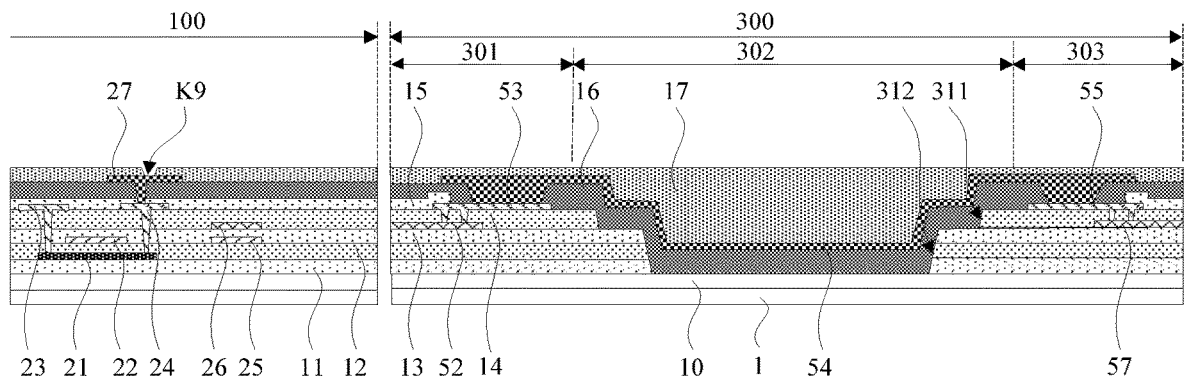
FIG. 18 is a schematic diagram of a display substrate after a pattern of a second planarization layer is formed in at least one embodiment of the present disclosure.

In some exemplary embodiments, a second planarization thin film is coated on the base substrate 10 where the above structures are formed to form a second planarization layer 17 covering the entire base substrate 10, and multiple seventh via holes K9 are formed on the second planarization layer 17 by a patterning process. As shown in FIG. 18, the multiple seventh via holes K9 are formed in the display region 100, and the second planarization layer 17 in any seventh via hole K9 is etched off to expose a surface of the connection electrode 27. In the second region 302 of the bending region 300, the second planarization layer 17 completely fills the first groove 311 and the second groove 312, so that the bending region 300 has a flat surface, that is, a surface of the second planarization layer 17 of the bending region 300 away from the base substrate 10 may be flush.

(12) Sequentially preparing an anode, a pixel definition layer, a post spacer layer, an organic light emitting layer, a cathode and an encapsulation layer on the base substrate.

Figure 19:
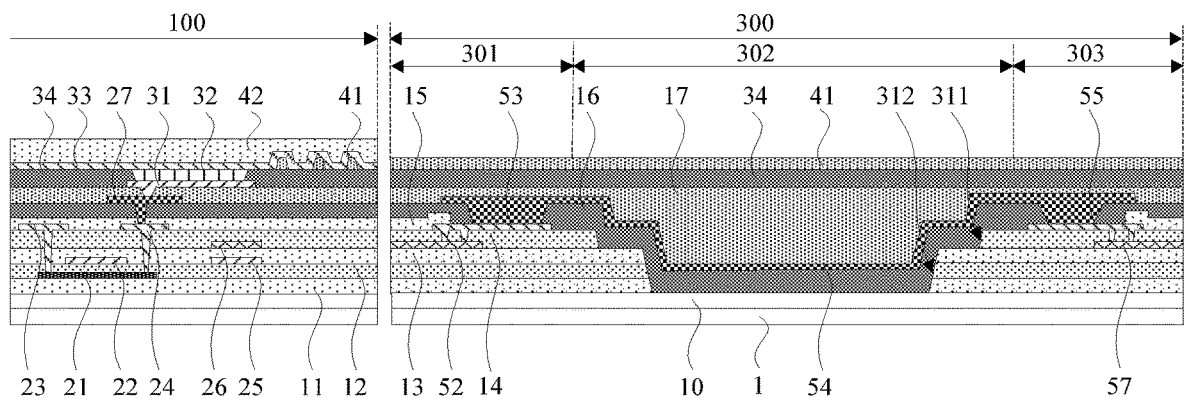
FIG. 19 is a schematic diagram of a display substrate after an encapsulation layer is formed in at least one embodiment of the present disclosure.

In some exemplary embodiments, a transparent conductive thin film is deposited on the base substrate 10 where the above structures are formed, and the transparent conductive thin film is patterned by a patterning process to form a pattern of an anode 31. As shown in FIG. 19, the pattern of the anode 31 is formed on the second planarization layer 17 of the display region 100 and connected to the connection electrode 27 through the seventh via hole. After this patterning process, the film layer structures of the bonding region 300 are not changed.

In some exemplary embodiments, a pixel definition thin film is coated on the base substrate 10 where the above structures are formed, and a pattern of a pixel definition layer (PDL) 34 is formed by mask, exposure and development processes. As shown in FIG. 19, the pixel definition layer 34 is formed in the display region 100 and the bending region 300. The pixel definition layer 34 of the display region 100 is provided with a pixel opening and the pixel definition thin film in the pixel opening is developed to expose a surface of the anode 31. The pixel definition layer 34 of the bending region 300 covers the second planarization layer 17.

In some exemplary embodiments, an organic material thin film is coated on the base substrate 10 where the above patterns are formed, and a pattern of a post spacer (PS) layer 41 is formed in the display region 100 and the bending region 300 by mask, exposure and development processes. As shown in FIG. 19, the post spacer layer 41 of the display region 100 includes multiple post spacers. The post spacer layer 41 of the bending region 300 covers the pixel definition layer 34.

In some exemplary embodiments, an organic light emitting layer 32 and a cathode 33 are sequentially formed on the base substrate 10 where the above patterns are formed. As shown in FIG. 19, the organic light emitting layer 32 includes a hole injection layer, a hole transmission layer, a light emitting layer, an electron transmission layer and an electron injection layer which are stacked, and is formed in the pixel opening of the display region 100 to realize a connection between the organic light emitting layer 32 and the anode 31. Since the anode 31 is connected to the connection electrode 27 and the connection electrode 27 is connected to the first drain electrode 24 of the first transistor, light emission control of the organic light emitting layer 32 is realized. A part of the cathode 33 is formed on the organic light emitting layer 32. After the patterning process, the film layer structures of the bonding region 300 are not changed.

In some exemplary embodiments, an encapsulation layer 42 is formed on the base substrate 10 where the above patterns are formed. As shown in FIG. 19, the encapsulation layer 42 is formed in the display region 100, and may adopt laminated structure of inorganic material/organic material/inorganic material. An organic material layer is disposed between two inorganic material layers. After the patterning process, the film layer structures of the bonding region 300 are not changed.

In some exemplary embodiments, the first planarization layer, the second planarization layer, the pixel definition layer and the post spacer layer may be made of materials such as polyimide, acrylic or polyethylene terephthalate, etc.

After the above film layer structures are prepared, the display substrate may be peeled off from the glass carrier 1 by a peeling process.

According to the display substrate provided by this exemplary embodiment, orthographic projections of the first insulator layer (i.e. the first planarization layer) and an edge of the second wiring layer close to the display region on the base substrate overlap with each other, and orthographic projections of an edge of the inorganic insulator layer and an edge of the second wiring layer on the base substrate overlap with each other, which is beneficial to protecting the first wiring layer in the bending region, thereby improving a corrosion resistance of the display substrate and further prolonging a service life of the display substrate in extreme environments.

The preparation process according to the present exemplary embodiment may be realized by using the existing mature preparation equipment, has less improvement on the existing process, may be well compatible with the existing preparation process, and has advantages of simple process realization, easy implementation, high production efficiency, low production cost and high yield rate.

The structure and the preparation process of the display substrate according to this exemplary embodiment is only an exemplary description. In some exemplary embodiments, corresponding structures may be changed and patterning processes may be added or reduced according to actual needs. For example, the multiple first data lead wires, the multiple second data lead wires, the multiple fourth data connection lines and the multiple fifth data connection lines may be disposed in a same layer as the first gate metal layer, or may be disposed in a same layer as the second gate metal layer. For another example, the third region of the bending region may not be provided with a fourth data connection line or a fifth data connection line and the third data connection line may extend to the bonding region. For another example, the display substrate may have a top emission structure or may have a bottom emission structure. For another example, the drive transistor may have a top gate structure, a bottom gate structure, a single gate structure, or a dual gate structure, which is not limited in the present embodiment.

The structure (or method) shown in the present embodiment may be appropriately combined with a structure (or method) shown in another embodiment.

Figure 20:
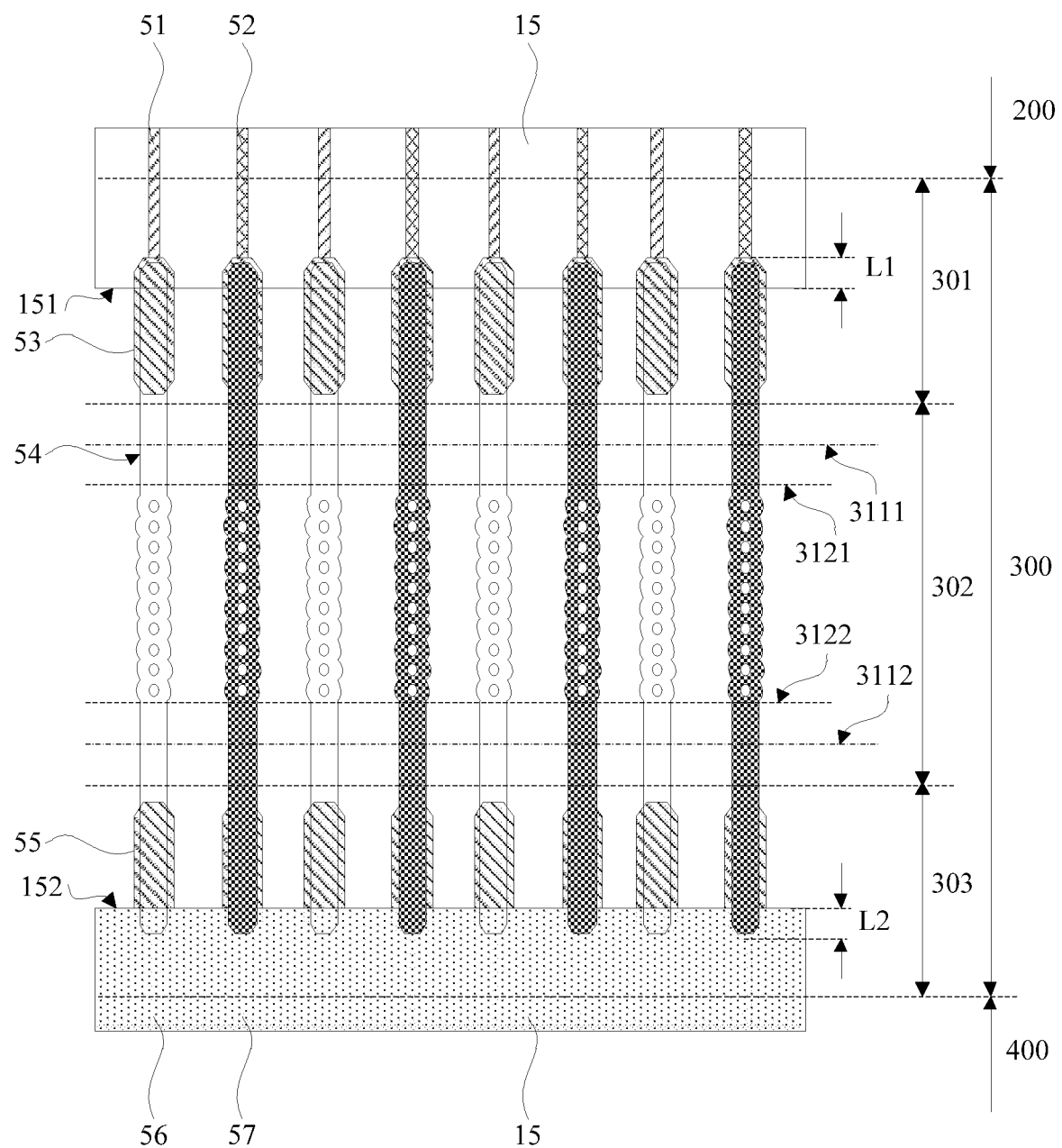
FIG. 20 is another schematic diagram of a structure of a bending region of a display substrate according to at least one embodiment of the present disclosure.
Figure 21:
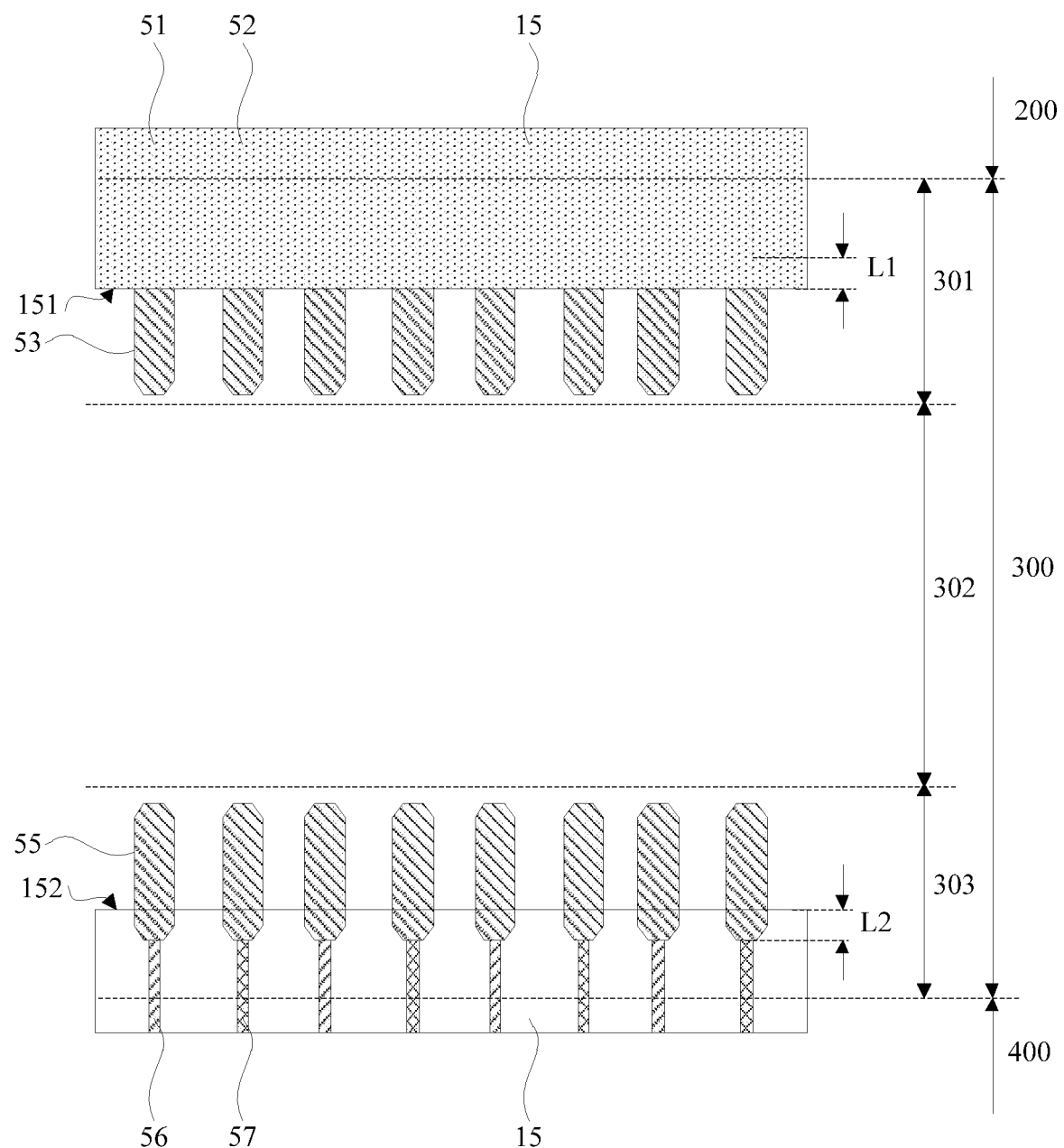
FIG. 21 is a plan view of a bending region after an inorganic insulator layer is formed in at least one embodiment of the present disclosure.

FIG. 20 is another schematic diagram of a structure of a bending region according to at least one embodiment of the present disclosure. FIG. 20 is a partially enlarged view of the region S in FIG. 1. FIG. 21 is a plan view of a bending region after an inorganic insulator layer is formed in at least one embodiment of the present disclosure;

In some exemplary embodiments, as shown in FIGS. 20 and 21, an inorganic insulator layer 15 has a first edge 151 and a second edge 152 in a bending region 300. The first edge 151 is located in a first region 301, and the second edge 152 is located in a third region 303. The inorganic insulator layer 15 between the first edge 151 and the second edge 152 is etched off. The first edge 151 and the second edge 152 are both straight edges. An extending direction of the first edge 151 is parallel to an extending direction of the second edge 152. The first edge 151 covers edges of multiple first data connection lines 53 close to the display region, and the second edge 152 covers edges of multiple third data connection lines 55 away from the display region. Along a direction from the bending region 300 to the display region, a first distance L1 between the first edge 151 of the inorganic insulator layer 15 and an edge of a first data connection line 53 covered by the first edge 151 may be greater than or equal to 5 microns (μm). Along a direction from the display region to the bending region 300, a second distance L2 between the second edge 152 of the inorganic insulator layer 15 and an edge of a third data connection line 55 covered by the second edge 152 may be greater than or equal to 5 μm. In some examples, the second distance L2 and the first distance L1 may be the same or different. However, this is not limited in the present embodiment.

A structure of the display region 100 and other structures of the bending region 300 in the present exemplary embodiment are similar to corresponding structures described in the previous embodiments, which will not be further described here.

The structure (or method) shown in the present embodiment may be appropriately combined with the structure (or method) shown in another embodiment.

Figure 22:
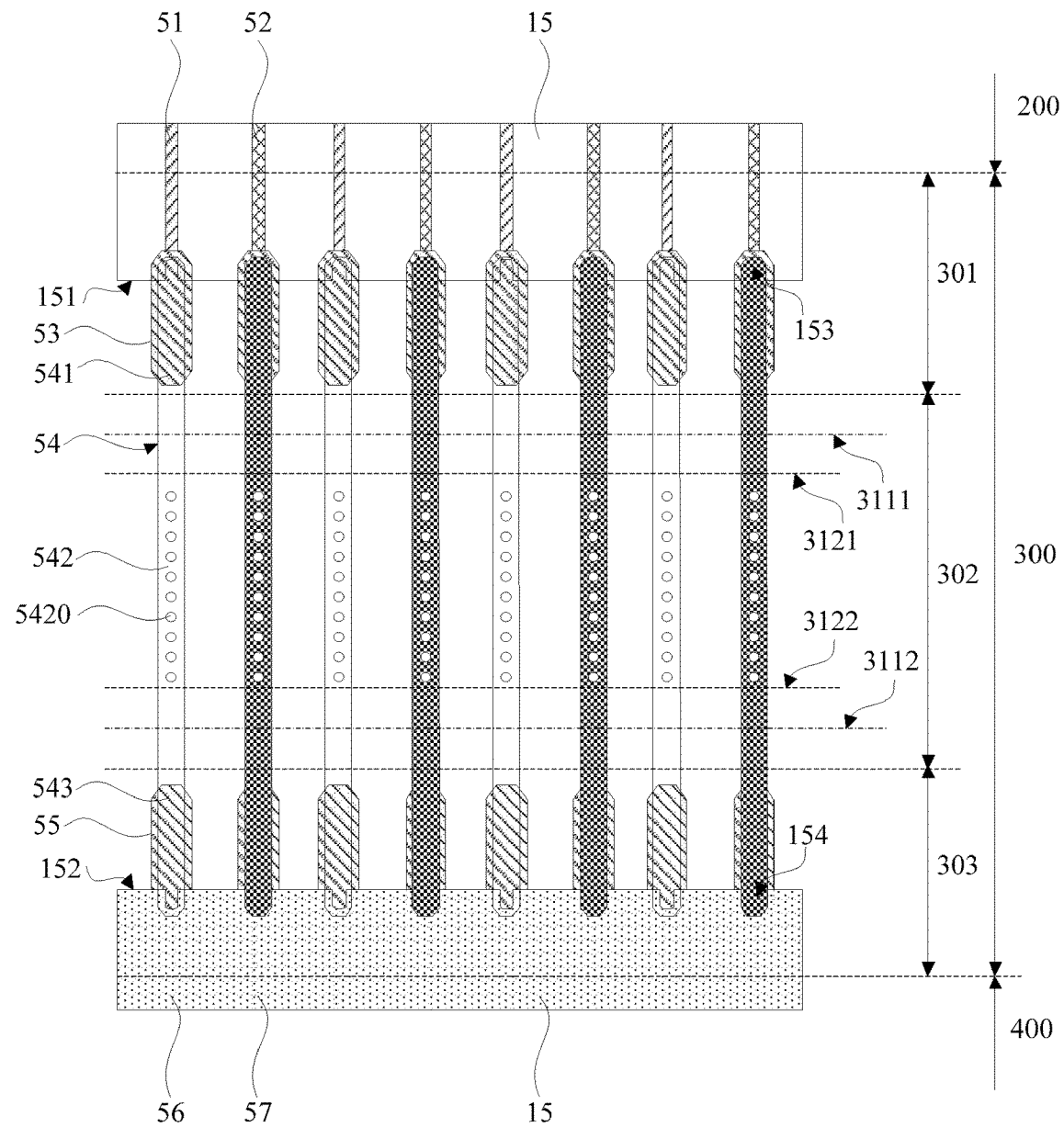
FIG. 22 is another schematic diagram of a structure of a bending region of a display substrate according to at least one embodiment of the present disclosure.

FIG. 22 is another schematic diagram of a structure of a bending region of a display substrate according to at least one embodiment of the present disclosure; FIG. 22 is a partially enlarged view of the region S in FIG. 1. In some exemplary embodiments, as shown in FIG. 22, in a plane parallel to the display substrate, at least one second data connection line 54 among the multiple second data connection lines includes a first wire section 541, a second wire section 542, and a third wire section 543 connected in sequence. The first wire section 541 is located in the first region 301 of the bending region 300, the second wire section 542 is located in the second region 302, and the third wire section 543 is located in the third region 303. The second data connection line 54 may be a straight line. Average widths of the first wire section 541, the second wire section 542, and the third wire section 543 may be substantially the same. In some examples, an average width of the second data connection lines 54 may range from 5 to 10 microns, and a distance between two adjacent second data connection lines 54 may range from 9 to 11 microns. For example, the average width of the second data connection lines 54 may be about 8 microns, and the distance between two adjacent second data connection lines 54 may be about 9 microns. The second wire section 542 of the second data connection line 54 in the second region 302 may have a hollow pattern. An orthographic projection of the hollow pattern on the base substrate may be located in the second groove defined by the third boundary 3121 and the fourth boundary 3122. The hollow pattern may include multiple holes 5420. The multiple holes 5420 are disposed in sequence along an extending direction of the second data connection line 54 in a row. Shapes and sizes of the multiple holes 5420 may be the same or different. For example, the multiple holes 5420 may all be circular or elliptical. However, arrangements, shapes and sizes of the multiple holes are not defined in the present embodiment. The hollow pattern disposed on the second data connection line 54 may relieve a stress accumulated on the second data connection line 54 during bending, which is beneficial to releasing the stress when the second data connection line 54 is bent, reducing a breakage risk of the second data connection line 54, thereby improving a bending effect.

A structure of the display region 100 and other structures of the bending region 300 in the present exemplary embodiment are similar to corresponding structures described in the previous embodiments, which will not be further described here.

The structure (or method) shown in the present embodiment may be appropriately combined with the structure (or method) shown in another embodiment.

Figure 23:
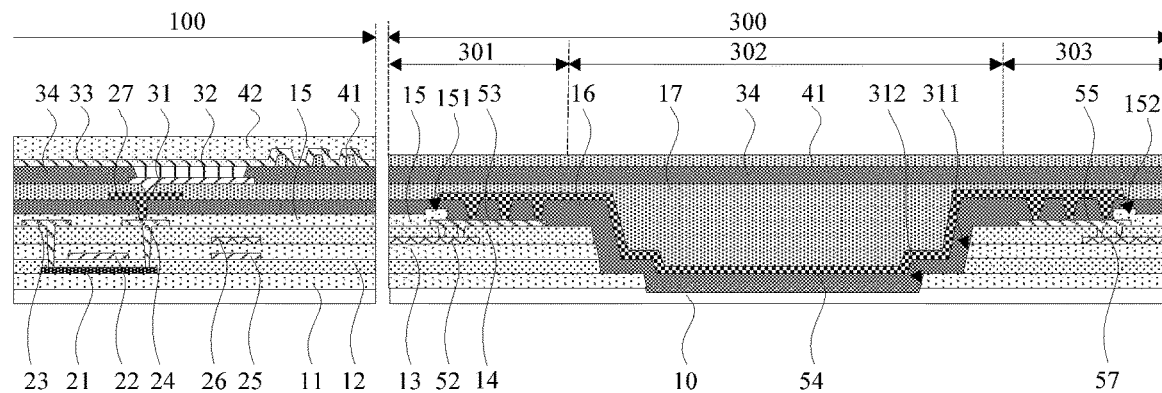
FIG. 23 is another schematic diagram of a structure of a display substrate according to at least one embodiment of the present disclosure.

FIG. 23 is another schematic diagram of a structure of a display substrate according to at least one embodiment of the present disclosure. FIG. 23 is another cross sectional view along the P-P direction in FIG. 1. In some exemplary embodiments, as shown in FIG. 23, in a plane perpendicular to the display substrate, each of the first region 301 and the third region 303 of the bending region 300 includes a base substrate 10 and a buffer layer 11, a first gate insulator layer 12, a first data lead wire layer, a second gate insulator layer 13, a second data lead wire layer, an interlayer dielectric layer 14, a second wiring layer, an inorganic insulator layer 15, a first planarization layer (i.e. the first insulator layer in the present embodiment)16, a third wiring layer, a second planarization layer 17, a pixel definition layer 34, and a post spacer layer 41 which are sequentially disposed on the base substrate 10. The first data lead wire layer includes multiple first data lead wires (not shown in FIG. 23) located in the first region 301 and multiple fourth data connection lines (not shown in FIG. 23) located in the third region 303, and the second data lead wire layer includes multiple second data lead wires (one second data lead wire 52 is illustrated in FIG. 23) located in the first region 301 and multiple fifth data connection lines (one fifth data connection line 57 is illustrated in FIG. 23) located in the third region 303. The second wiring layer includes multiple first data connection lines (one first data connection line 53 is illustrated in FIG. 23) located in the first region 301 and multiple third data connection lines (one third data connection line 55 is illustrated in FIG. 23) located in the third region 303. The third wiring layer includes multiple second data connection lines (one second data connection line 54 is illustrated in FIG. 23).

In some exemplary embodiments, as shown in FIG. 23, in the first region 301, the first data connection line 53 is connected to the second data lead wire 52 through multiple via holes (e.g., two via holes) formed on the interlayer dielectric layer 14 or to the first data lead wire through multiple via holes (e.g., two via holes) formed on the interlayer dielectric layer 14 and the second gate insulator layer 13. The second data connection line 54 is connected to a first data connection line 53 through multiple first openings (for example, three first openings) disposed on the first planarization layer 16. In the third region 303, the third data connection line 55 is connected to the fifth data connection line 57 through multiple via holes (e.g., two via holes) formed on the interlayer dielectric layer 14 or connected to the fourth data connection line through multiple via holes (e.g., two via holes) formed on the interlayer dielectric layer 14 and the second gate insulator layer 13. The second data connection line 54 is connected to one third data connection line 55 through multiple first openings (for example, three first openings) disposed on the first planarization layer 16. In this exemplary embodiment, structures in the first region 301 and the third region 303 of the bending region 300 are symmetrical with each other, and the symmetry axis is perpendicular to an extending direction of the data connection lines. However, this is not limited in the present embodiment. In some examples, a structure in the third region of the bending region may be different or partially the same as a structure in the first region.

In some exemplary embodiments, as shown in FIG. 23, in a plane perpendicular to the display substrate, the second region 302 of the bending region 300 includes a base substrate 10, and a composite insulator layer, a first planarization layer 16, a third wiring layer, a second planarization layer 17, a pixel definition layer 34 and a post spacer layer 41 which are sequentially disposed on the base substrate 10. The composite insulator layer includes a buffer layer 11, a first gate insulator layer 12, a second gate insulator layer 13, and an interlayer dielectric layer 14 which are sequentially disposed on the base substrate 10. The base substrate 10 includes a first flexible material layer, a first inorganic material layer (also called a first barrier layer), a semiconductor layer, a second flexible material layer and a second inorganic material layer (also called a second barrier layer) which are sequentially stacked. The second region 302 is provided with a first groove 311 and a second groove 312. The first groove 311 is formed by an EBA MASK process, the interlayer dielectric layer 14, the second gate insulator layer 13 and the first gate insulator layer 12 in the first groove 311 are etched off, and the buffer layer 11 is exposed by the first groove 311. The second groove 312 is formed by an EBB MASK process, the second groove 312 is formed in the first groove 311, and the buffer layer 11 and the second barrier layer of the base substrate 10 in the second groove 312 are etched off. The second groove 312 exposes the second flexible material layer of the base substrate 10. An orthographic projection of the second groove 312 on the base substrate 10 is located in an orthographic projection of the first groove 311 on the base substrate 10. The second groove 312 is filled with the first planarization layer 16. The first groove 311 is filled with the second planarization layer 17. However, this is not limited in the present embodiment. In some examples, during the EBA MASK process, the interlayer dielectric layer, the second gate insulator layer, the first gate insulator layer and part of the buffer layer may be etched off.

A structure of the display region 100 and other structures of the bending region 300 in the present exemplary embodiment are similar to corresponding structures described in the previous embodiments, which will not be further described here.

The structure (or method) shown in the present embodiment may be appropriately combined with the structure (or method) shown in another embodiment.

Figure 24:
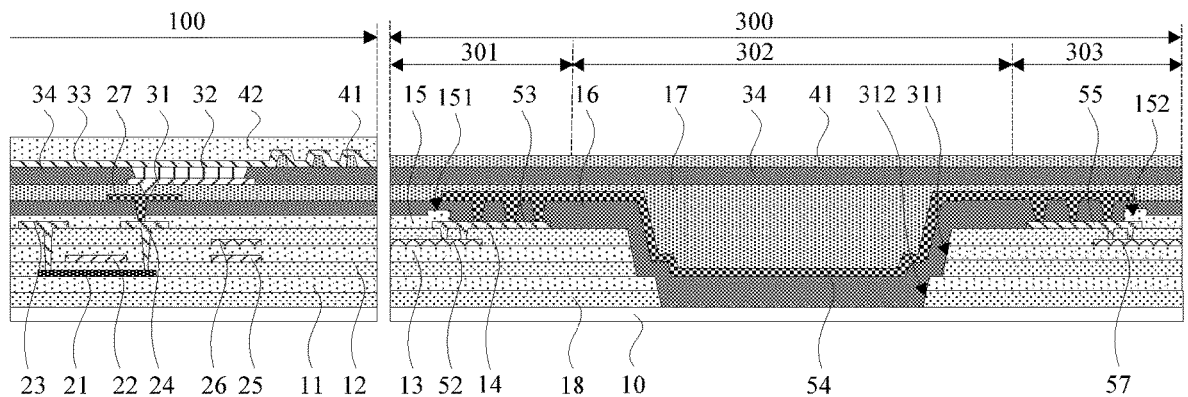
FIG. 24 is another schematic diagram of a structure of a display substrate according to at least one embodiment of the present disclosure.

FIG. 24 is another schematic diagram of a structure of a display substrate according to at least one embodiment of the present disclosure. FIG. 24 is another cross sectional view along the P-P direction in FIG. 1. In some exemplary embodiments, as shown in FIG. 24, in a plane perpendicular to the display substrate, each of the first region 301 and the third region 303 of the bending region 300 includes a base substrate 10 and a barrier layer 18, a buffer layer 11, a first gate insulator layer 12, a first data lead wire layer, a second gate insulator layer 13, a second data lead wire layer, an interlayer dielectric layer 14, a second wiring layer, an inorganic insulator layer 15, a first planarization layer (i.e. the first insulator layer in the present embodiment)16, a third wiring layer, a second planarization layer 17, a pixel definition layer 34, and a post spacer layer 41 which are sequentially disposed on the base substrate 10. The first data lead wire layer includes multiple first data lead wires (not shown in FIG. 24) located in the first region 301 and multiple fourth data connection lines (not shown in FIG. 24) located in the third region 303, and the second data lead wire layer includes multiple second data lead wires (one second data lead wire 52 is illustrated in FIG. 24) located in the first region 301 and multiple fifth data connection lines (one fifth data connection line 57 is illustrated in FIG. 24) located in the third region 303. The second wiring layer includes multiple first data connection lines (one first data connection line 53 is illustrated in FIG. 24) located in the first region 301 and multiple third data connection lines (one third data connection line 55 is illustrated in FIG. 24) located in the third region 303. The third wiring layer includes multiple second data connection lines (one second data connection line 54 is illustrated in FIG. 24).

In some exemplary embodiments, as shown in FIG. 24, in a plane perpendicular to the display substrate, the second region 302 of the bending region 300 includes a base substrate 10, and a composite insulator layer, a first planarization layer 16, a third wiring layer, a second planarization layer 17, a pixel definition layer 34 and a post spacer layer 41 which are sequentially disposed on the base substrate 10. The composite insulator layer includes a barrier layer 18, a buffer layer 11, a first gate insulator layer 12, a second gate insulator layer 13, and an interlayer dielectric layer 14 which are sequentially disposed on the base substrate 10. The base substrate 10 may at least include a flexible material layer formed by a flexible material. The composite insulator layer of the second region 302 is provided with a first groove 311 and a second groove 312. An orthographic projection of the second groove 312 on the base substrate 10 is located in an orthographic projection of the first groove 311 on the base substrate 10. The first groove 311 is formed by an EBA MASK process, the interlayer dielectric layer 14, the second gate insulator layer 13 and the first gate insulator layer 12 in the first groove 311 are etched off, and the buffer layer 11 is exposed by the first groove 311. The second groove 312 is formed by an EBB MASK process, the second groove 312 is formed in the first groove 311, and the buffer layer 11 and the barrier layer 18 in the second groove 312 are etched off, and the base substrate 10 is exposed by the second groove 312. The second groove 312 is filled with the first planarization layer 16. The first groove 311 is filled with the second planarization layer 17. However, this is not limited in the present embodiment. In some examples, during the EBA MASK process, the interlayer dielectric layer, the second gate insulator layer, the first gate insulator layer and part of the buffer layer may be etched off.

A structure of the display region 100 and other structures of the bending region 300 in the present exemplary embodiment are similar to corresponding structures described in the previous embodiments, which will not be further described here.

The structure (or method) shown in the present embodiment may be appropriately combined with the structure (or method) shown in another embodiment.

Figure 25:
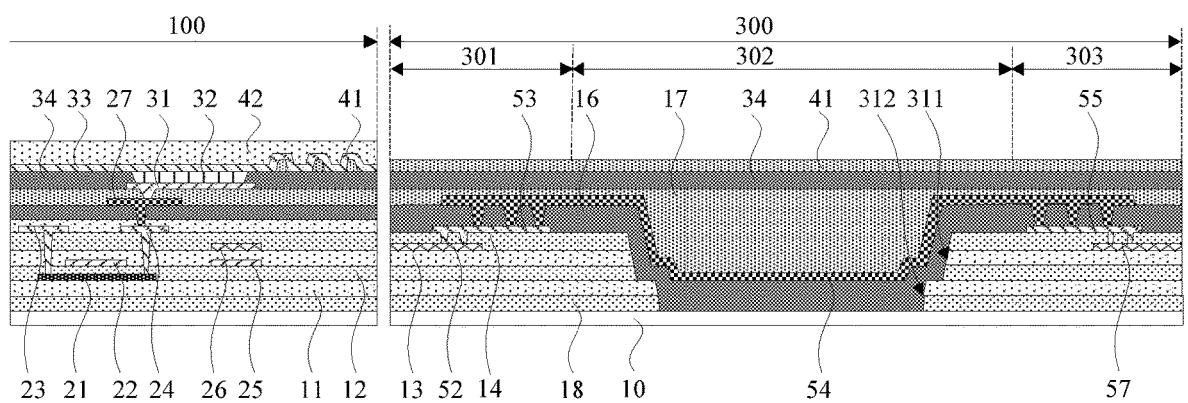
FIG. 25 is another schematic diagram of a structure of a display substrate according to at least one embodiment of the present disclosure.

FIG. 25 is another schematic diagram of a structure of a display substrate according to at least one embodiment of the present disclosure. FIG. 25 is another cross sectional view along the P-P direction in FIG. 1. In some exemplary embodiments, as shown in FIG. 25, in a plane perpendicular to the display substrate, each of the first region 301 and the third region 303 of the bending region 300 includes a base substrate 10 and a barrier layer 18, a buffer layer 11, a first gate insulator layer 12, a first data lead wire layer, a second gate insulator layer 13, a second data lead wire layer, an interlayer dielectric layer 14, a second wiring layer, a first planarization layer 16 (i.e. the first insulator layer in the present embodiment), a third wiring layer, a second planarization layer 17, a pixel definition layer 34, and a post spacer layer 41 which are sequentially disposed on the base substrate 10. The first data lead wire layer includes multiple first data lead wires (not shown in FIG. 25) located in the first region 301 and multiple fourth data connection lines (not shown in FIG. 25) located in the third region 303, and the second data lead wire layer includes multiple second data lead wires (one second data lead wire 52 is illustrated in FIG. 25) located in the first region 301 and multiple fifth data connection lines (one fifth data connection line 57 is illustrated in FIG. 25) located in the third region 303. The second wiring layer includes multiple first data connection lines (one first data connection line 53 is illustrated in FIG. 25) located in the first region 301 and multiple third data connection lines (one third data connection line 55 is illustrated in FIG. 25) located in the third region 303. The third wiring layer includes multiple second data connection lines (one second data connection line 54 is illustrated in FIG. 25). In this exemplary embodiment, in the bending region, an orthographic projection of the first insulator layer on the base substrate overlaps with an orthographic projection of an edge of the second wiring layer close to the display region on the base substrate, which is beneficial to protecting the first wiring layer in the bending region, thereby improving the corrosion resistance of the display substrate and further prolonging the service life of the display substrate in extreme environments.

In some exemplary embodiments, as shown in FIG. 25, in a plane perpendicular to the display substrate, the second region 302 of the bending region 300 includes a base substrate 10, and a composite insulator layer, a first planarization layer 16, a pixel definition layer 34 and a post spacer layer 41 which are sequentially disposed on the base substrate 10. The composite insulator layer includes a barrier layer 18, a buffer layer 11, a first gate insulator layer 12, a second gate insulator layer 13, and an interlayer dielectric layer 14 which are sequentially disposed on the base substrate 10. The base substrate 10 at least includes a flexible material layer. The second region 302 is provided with a first groove 311 and a second groove 312. The first groove 311 is formed by an EBA MASK process, the interlayer dielectric layer 14, the second gate insulator layer 13 and the first gate insulator layer 12 in the first groove 311 are etched off, and the buffer layer 11 is exposed by the first groove 311. The second groove 312 is formed by an EBB MASK process, the second groove 312 is formed in the first groove 311, and the buffer layer 11 and the barrier layer 18 in the second groove 312 are etched off, and the base substrate 10 is exposed by the second groove 312. The second groove 312 is filled with the first planarization layer 16. The first groove 311 is filled with the second planarization layer 17. However, this is not limited in the present embodiment. In some examples, during the EBA MASK process, the interlayer dielectric layer, the second gate insulator layer, the first gate insulator layer and part of the buffer layer may be etched off.

A structure of the display region 100 and other structures of the bending region 300 in the present exemplary embodiment are similar to corresponding structures described in the previous embodiments, which will not be further described here.

The structure (or method) shown in the present embodiment may be appropriately combined with the structure (or method) shown in another embodiment.

Figure 26:
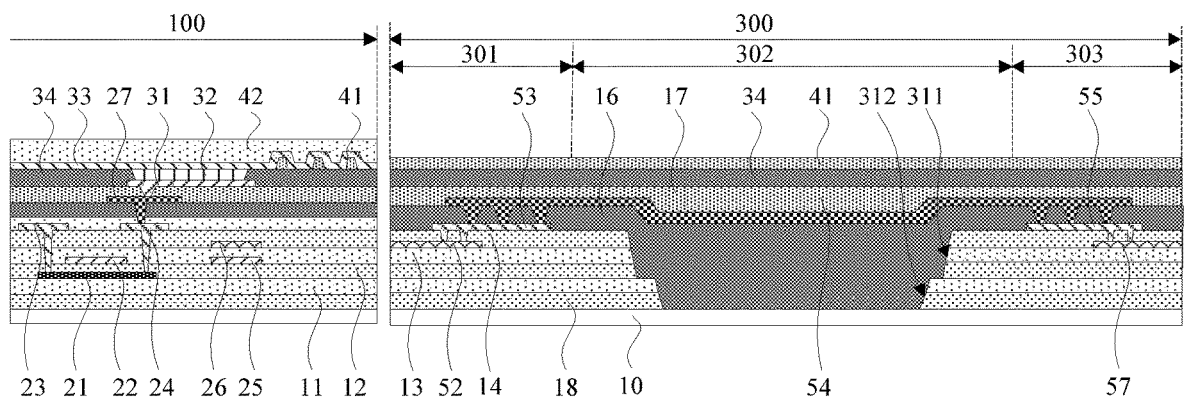
FIG. 26 is another schematic diagram of a structure of a display substrate according to at least one embodiment of the present disclosure.

FIG. 26 is another schematic diagram of a structure of a display substrate according to at least one embodiment of the present disclosure. FIG. 26 is another cross sectional view along the P-P direction in FIG. 1. In some exemplary embodiments, as shown in FIG. 26, in a plane perpendicular to the display substrate, each of the first region 301 and the third region 303 of the bending region 300 includes a base substrate 10 and a barrier layer 18, a buffer layer 11, a first gate insulator layer 12, a first data lead wire layer, a second gate insulator layer 13, a second data lead wire layer, an interlayer dielectric layer 14, a second wiring layer, a first planarization layer 16 (i.e. the first insulator layer in the present embodiment), a third wiring layer, a second planarization layer 17, a pixel definition layer 34, and a post spacer layer 41 which are sequentially disposed on the base substrate 10. The first data lead wire layer includes multiple first data lead wires (not shown in FIG. 26) located in the first region 301 and multiple fourth data connection lines (not shown in FIG. 26) located in the third region 303, and the second data lead wire layer includes multiple second data lead wires (one second data lead wire 52 is illustrated in FIG. 26) located in the first region 301 and multiple fifth data connection lines (one fifth data connection line 57 is illustrated in FIG. 26) located in the third region 303. The second wiring layer includes multiple first data connection lines (one first data connection line 53 is illustrated in FIG. 26) located in the first region 301 and multiple third data connection lines (one third data connection line 55 is illustrated in FIG. 26) located in the third region 303. The third wiring layer includes multiple second data connection lines (one second data connection line 54 is illustrated in FIG. 26). In this exemplary embodiment, in the bending region, an orthographic projection of the first insulator layer on the base substrate overlaps with an orthographic projection of an edge of the second wiring layer close to the display region on the base substrate, which is beneficial to protecting the first wiring layer in the bending region, thereby improving the corrosion resistance of the display substrate and further prolonging the service life of the display substrate in extreme environments.

In some exemplary embodiments, as shown in FIG. 26, in a plane perpendicular to the display substrate, the second region 302 of the bending region 300 includes a base substrate 10, and a composite insulator layer, a first planarization layer 16, a pixel definition layer 34 and a post spacer layer 41 which are sequentially disposed on the base substrate 10. The composite insulator layer includes a barrier layer 18, a buffer layer 11, a first gate insulator layer 12, a second gate insulator layer 13, and an interlayer dielectric layer 14 which are sequentially disposed on the base substrate 10. The base substrate 10 at least includes a flexible material layer. The second region 302 is provided with a first groove 311 and a second groove 312. The first groove 311 is formed by an EBA MASK process, the interlayer dielectric layer 14, the second gate insulator layer 13 and the first gate insulator layer 12 in the first groove 311 are etched off, and the buffer layer 11 is exposed by the first groove 311. The second groove 312 is formed by an EBB MASK process, the second groove 312 is formed in the first groove 311, and the buffer layer 11 and the barrier layer 18 in the second groove 312 are etched off, and the base substrate 10 is exposed by the second groove 312. However, this is not limited in the present embodiment. In some examples, during the EBA MASK process, the interlayer dielectric layer, the second gate insulator layer, the first gate insulator layer and part of the buffer layer may be etched off. In this exemplary embodiment, both the second groove 312 and the first groove 11 are filled with the first planarization layer 16. The first planarization layer 16 may adjust a thickness of steps formed by the grooves through filling the first groove 311 and the second groove 312, thereby reducing risks of breakage of the third wiring layer due to an excessive thickness of the steps formed by the second groove.

A structure of the display region 100 and other structures of the bending region 300 in the present exemplary embodiment are similar to corresponding structures described in the previous embodiments, which will not be further described here.

The structure (or method) shown in the present embodiment may be appropriately combined with the structure (or method) shown in another embodiment.

Figure 27:
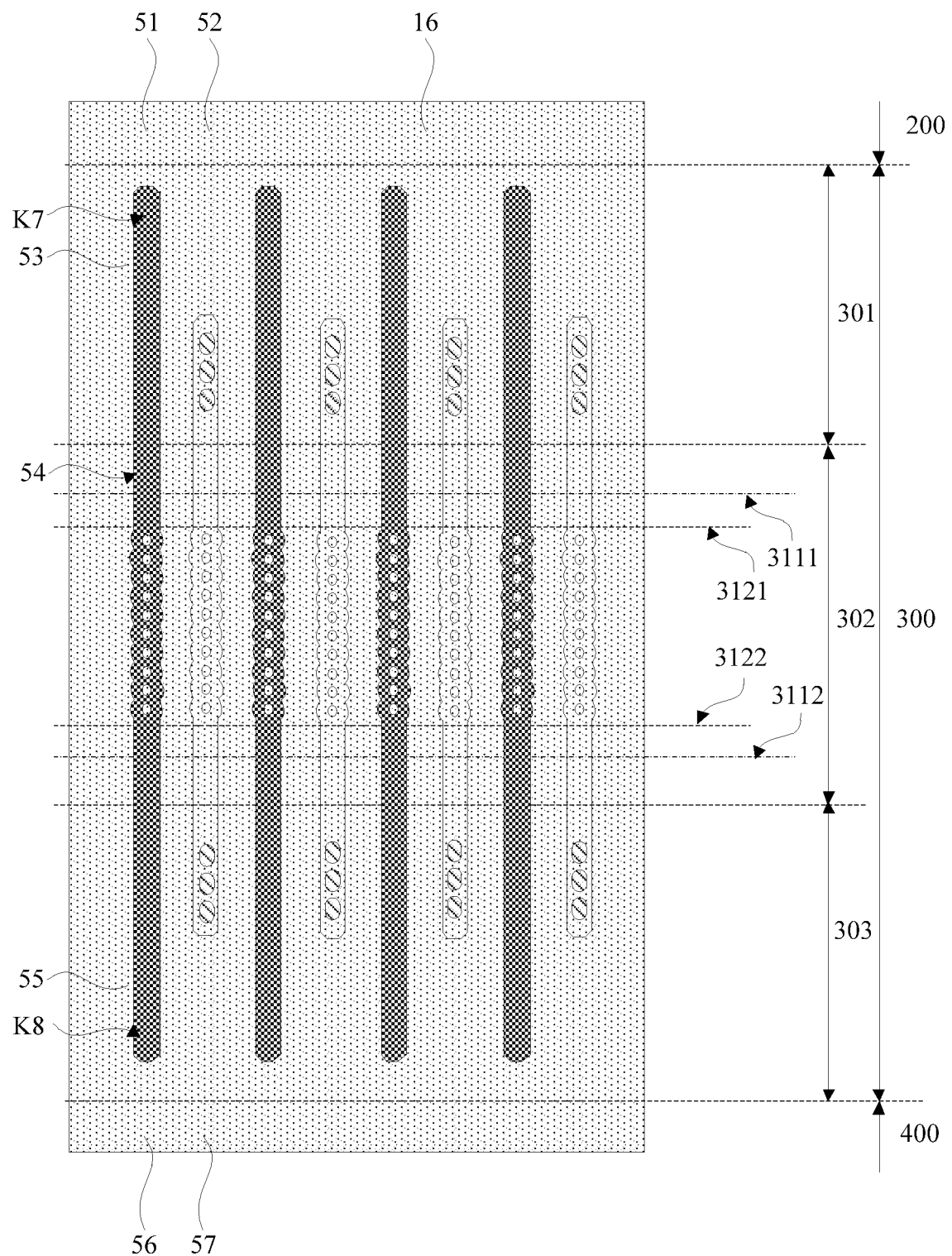
FIG. 27 is another schematic diagram of a structure of a bending region of a display substrate according to at least one embodiment of the present disclosure.
Figure 28:
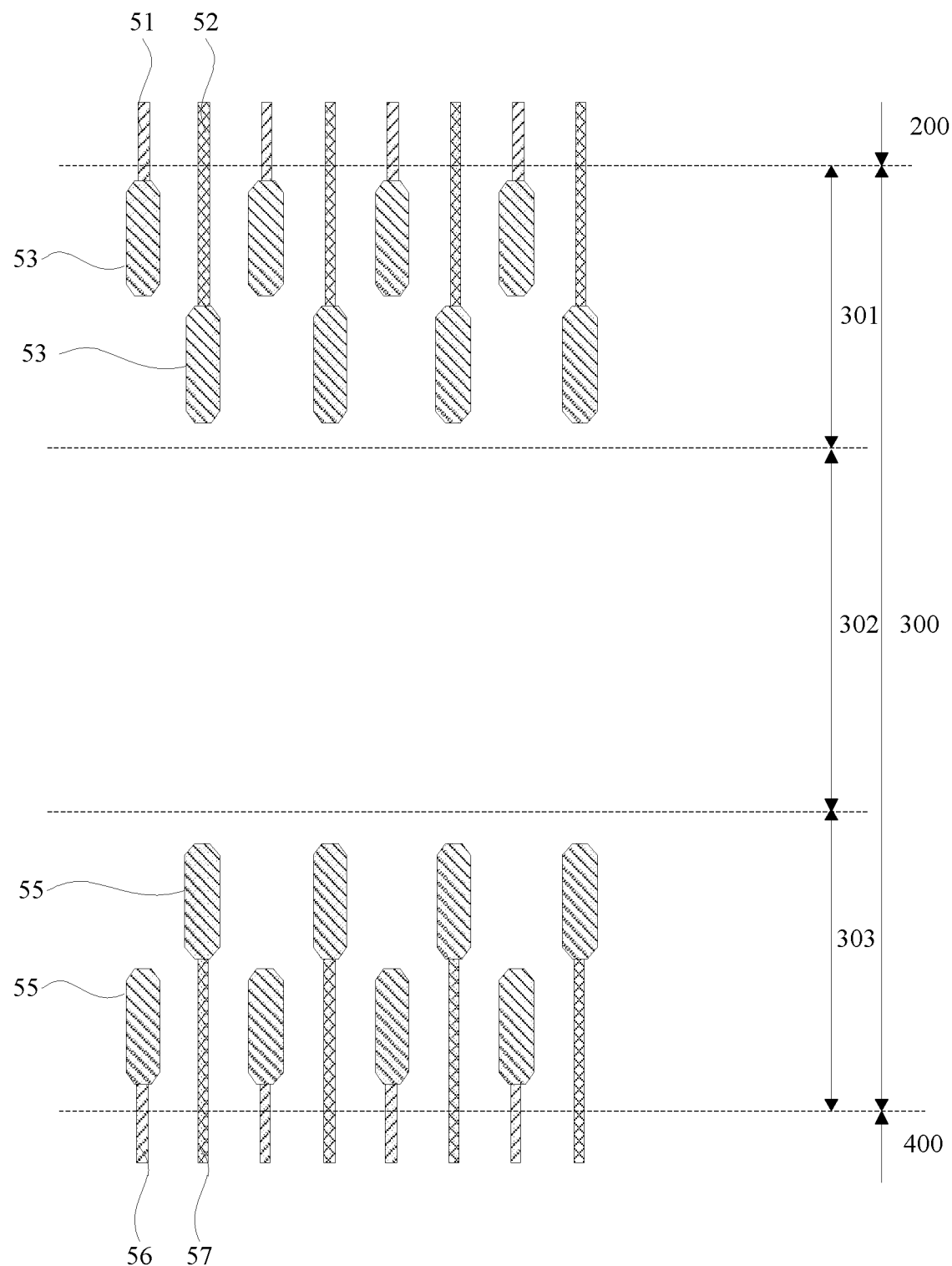
FIG. 28 is a plan view of a bending region after a pattern of a second wiring layer is formed in at least one embodiment of the present disclosure.
Figure 29:
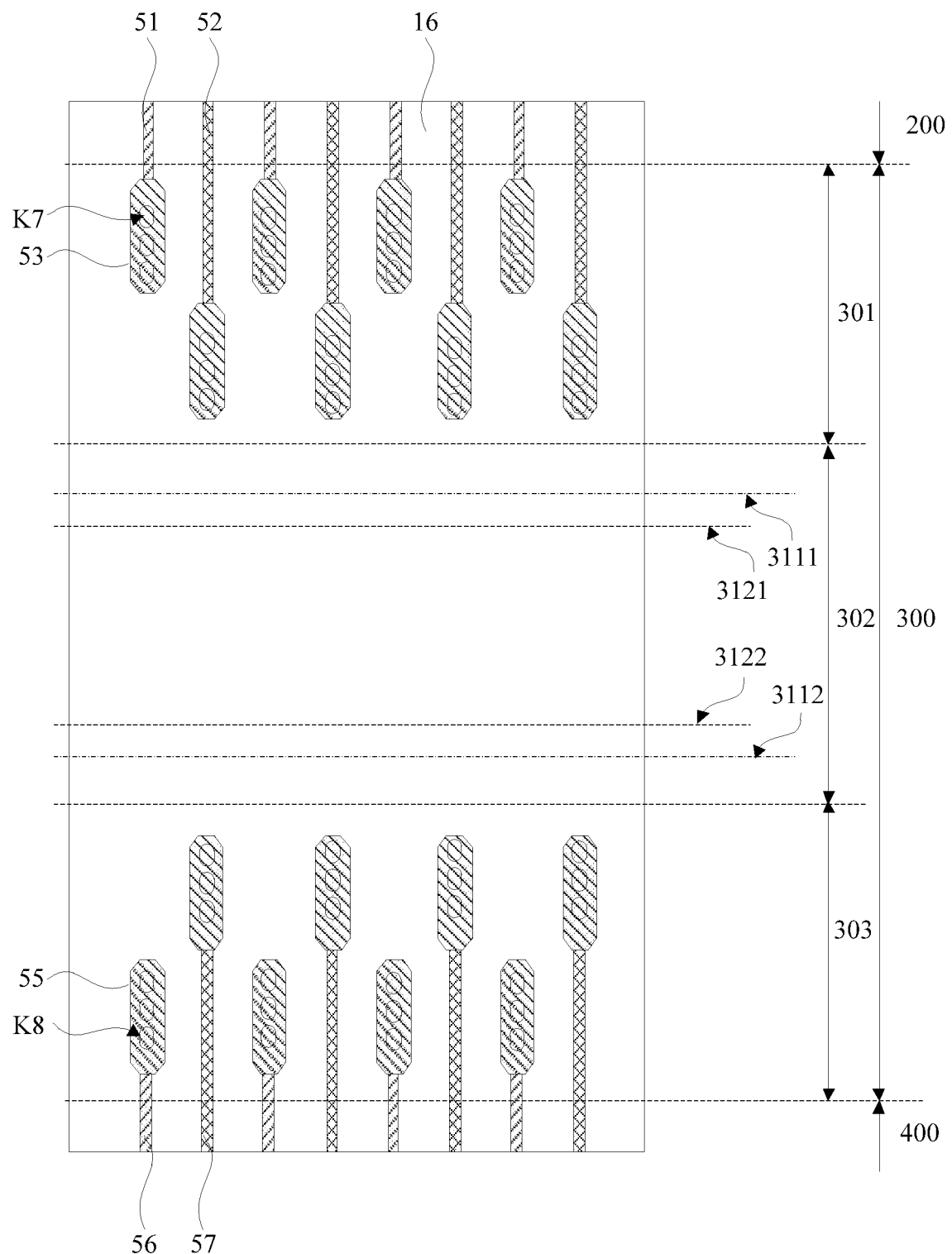
FIG. 29 is a plan view of a bending region after a pattern of a first insulator layer is formed in at least one embodiment of the present disclosure.

FIG. 27 is another schematic diagram of a structure of a bending region of a display substrate according to at least one embodiment of the present disclosure. FIG. 27 is a partially enlarged schematic diagram of the region S in FIG. 1. FIG. 28 is a plan view of a bending region after a pattern of a second wiring layer is formed in at least one embodiment of the present disclosure. FIG. 29 is a plan view of a bending region after a pattern of a first insulator layer is formed in at least one embodiment of the present disclosure.

In some exemplary embodiments, as shown in FIGS. 27 to 29, in a plane parallel to the display substrate, the bending region 300 includes multiple first data lead wires 51, multiple second data lead wires 52, multiple first data connection lines 53, multiple second data connection lines 54, multiple third data connection lines 55, multiple fourth data connection lines 56 and multiple fifth data connection lines 57. The multiple first data connection lines 53 are located in the first region 301 of the bending region 300 and disposed in a staggered manner. The multiple third data connection lines 55 are located in the third region 303 of the bending region 300 and disposed in a staggered manner. The multiple first data connection lines 53 are disposed in two rows, and first data connection lines 53 in the second row are located on a side of first data connection lines 53 in the first row away from the display region, and there is a misalignment between the first data connection lines 53 in the two rows. Extending directions of the multiple first data connection lines 53 are parallel to each other and do not overlap, and the multiple first data connection lines 53 in each row are sequentially disposed along a vertical direction of the extending direction of the data connection line. The multiple third data connection lines 55 are disposed in two rows, and third data connection lines 55 in the second row are located on a side of third data connection lines 55 in the first row away from the display region, and there is a misalignment between the third data connection lines 55 in the two rows. Extending directions of the multiple third data connection lines 55 are parallel to each other and do not overlap, and the multiple third data connection lines 55 in each row are sequentially disposed along a vertical direction of the extending direction of the data connection line. As shown in FIGS. 27 and 29, the multiple first data connection lines 53 and the multiple third data connection lines 55 in the bending region 300 overlap with the first insulator layer 16, but do not overlap with the inorganic insulator layer. The first insulator layer 16 is provided with multiple first openings K7 in the first region 301, and multiple second openings K8 in the third region 303 of the bending region 300. One second data connection line 54 may be connected to one first data connection line 53 through three first openings K7 and one third data connection line 55 through three second openings K8. However, this is not limited in the present embodiment. In this exemplary embodiment, by disposing multiple first data connection lines in a staggered manner, a distance between adjacent first data connection lines can be reduced, transmission interference of the adjacent first data connection lines can be reduced, and signal transmission performance can be improved. By disposing multiple third data connection lines in a staggered manner, a distance between adjacent third data connection lines can be reduced, transmission interference of the adjacent third data connection lines can be reduced, and signal transmission performance can be improved.

A structure of the display region 100 and other structures of the bending region 300 in the present exemplary embodiment are similar to corresponding structures described in the previous embodiments (for example, similar to the structures of the embodiments shown in FIG. 25 or FIG. 26), which will not be further described here.

The structure (or method) shown in the present embodiment may be appropriately combined with the structure (or method) shown in another embodiment.

Figure 30:
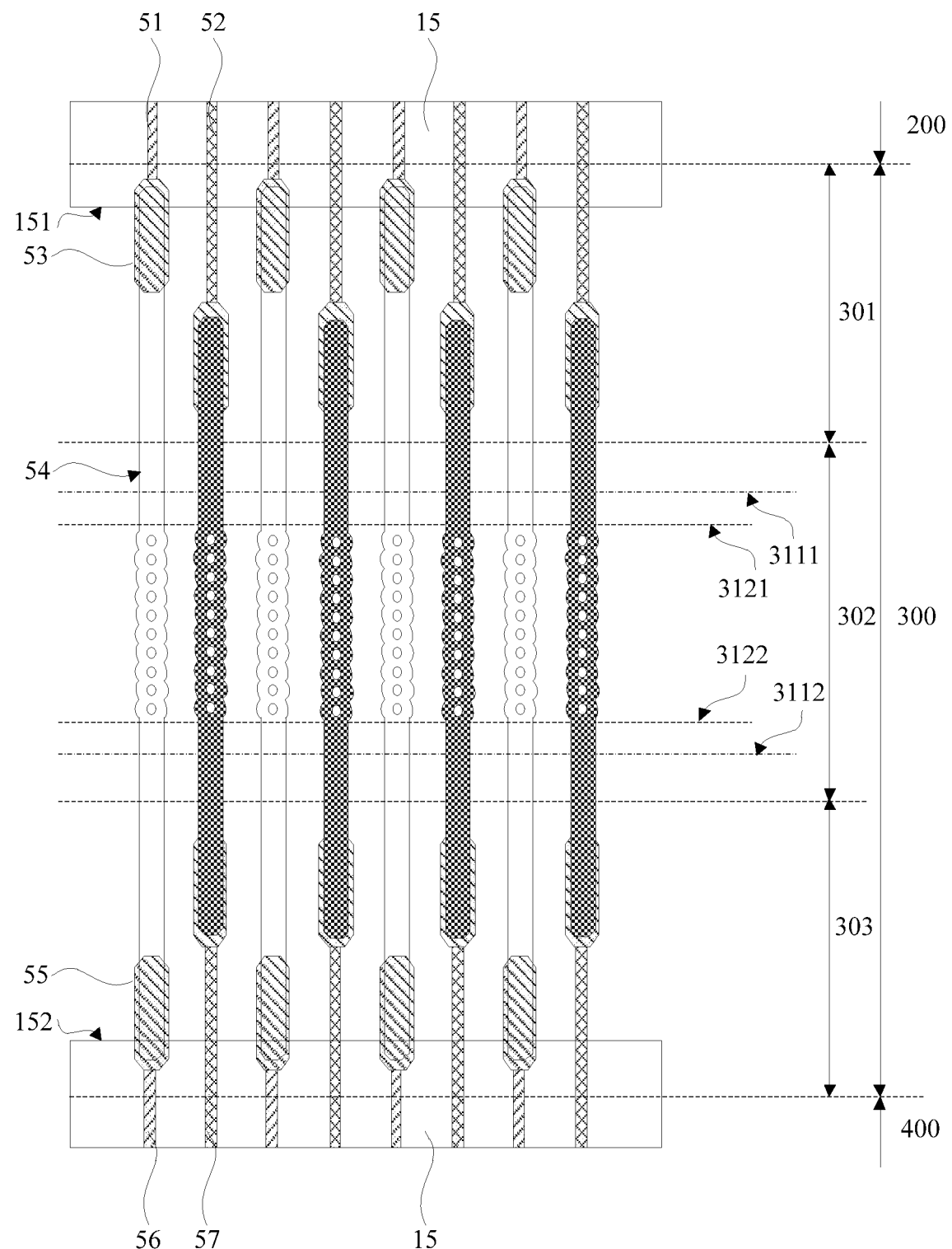
FIG. 30 is another schematic diagram of a structure of a bending region of a display substrate according to at least one embodiment of the present disclosure.

FIG. 30 is another schematic diagram of a structure of a bending region of a display substrate according to at least one embodiment of the present disclosure. FIG. 30 is a partially enlarged schematic diagram of the region S in FIG. 1. In some exemplary embodiments, as shown in FIG. 30, in a plane parallel to the display substrate, the bending region 300 includes multiple first data lead wires 51, multiple second data lead wires 52, multiple first data connection lines 53, multiple second data connection lines 54, multiple third data connection lines 55, multiple fourth data connection lines 56 and multiple fifth data connection lines 57. The multiple first data connection lines 53 are located in the first region 301 of the bending region 300 and disposed in a staggered manner. The multiple third data connection lines 55 are located in the third region 303 of the bending region 300 and disposed in a staggered manner. The multiple first data connection lines 53 are disposed in two rows, and first data connection lines 53 in the second row are located on a side of first data connection lines 53 in the first row away from the display region, and there is a misalignment between the first data connection lines 53 in the two rows. The multiple third data connection lines 55 are disposed in two rows, and third data connection lines 55 in the second row are located on a side of third data connection lines 55 in the first row away from the display region, and there is a misalignment between the third data connection lines 55 in the two rows. An inorganic insulator layer 15 has a first edge 151 and a second edge 152 in the bending region 300. The first edge 151 is located in the first region 301, and the second edge 152 is located in the third region 303. The inorganic insulator layer 15 between the first edge 151 and the second edge 152 is etched off. The first edge 151 and the second edge 152 are both straight edges. An extending direction of the first edge 151 is parallel to an extending direction of the second edge 152. The first edge 151 covers edges of the first data connection lines 53 in the first row close to the display region, and the second edge 152 covers edges of the third data connection lines 55 in the second row away from the display region.

A structure of the display region 100 and other structures of the bending region 300 in the present exemplary embodiment are similar to corresponding structures described in the previous embodiments (for example, similar to the structures of the embodiments shown in FIG. 2, 23 or 24), which will not be further described here.

The structure of the display substrate according to this exemplary embodiment is only an exemplary description. In an exemplary embodiment, corresponding structures may be changed according to actual needs. For example, the multiple first data lead wires, the multiple second data lead wires, the multiple fourth data connection lines and the multiple fifth data connection lines may be disposed in a same layer as the first gate metal layer, or may be disposed in a same layer as the second gate metal layer. For another example, the first edge and the second edge of the inorganic insulator layer at the bending region may be provided with a wave structure. For another example, the first edge of the inorganic insulator layer may cover the first data connection line in the first row and an edge of the first data connection line in the second row close to the display region. For another example, the second edge of the inorganic insulator layer may cover the third data connection line in the second row and an edge of the third data connection line in the first row close to the display region, which is not limited in the present embodiment.

The structure (or method) shown in the present embodiment may be appropriately combined with the structure (or method) shown in another embodiment.

Figure 31:
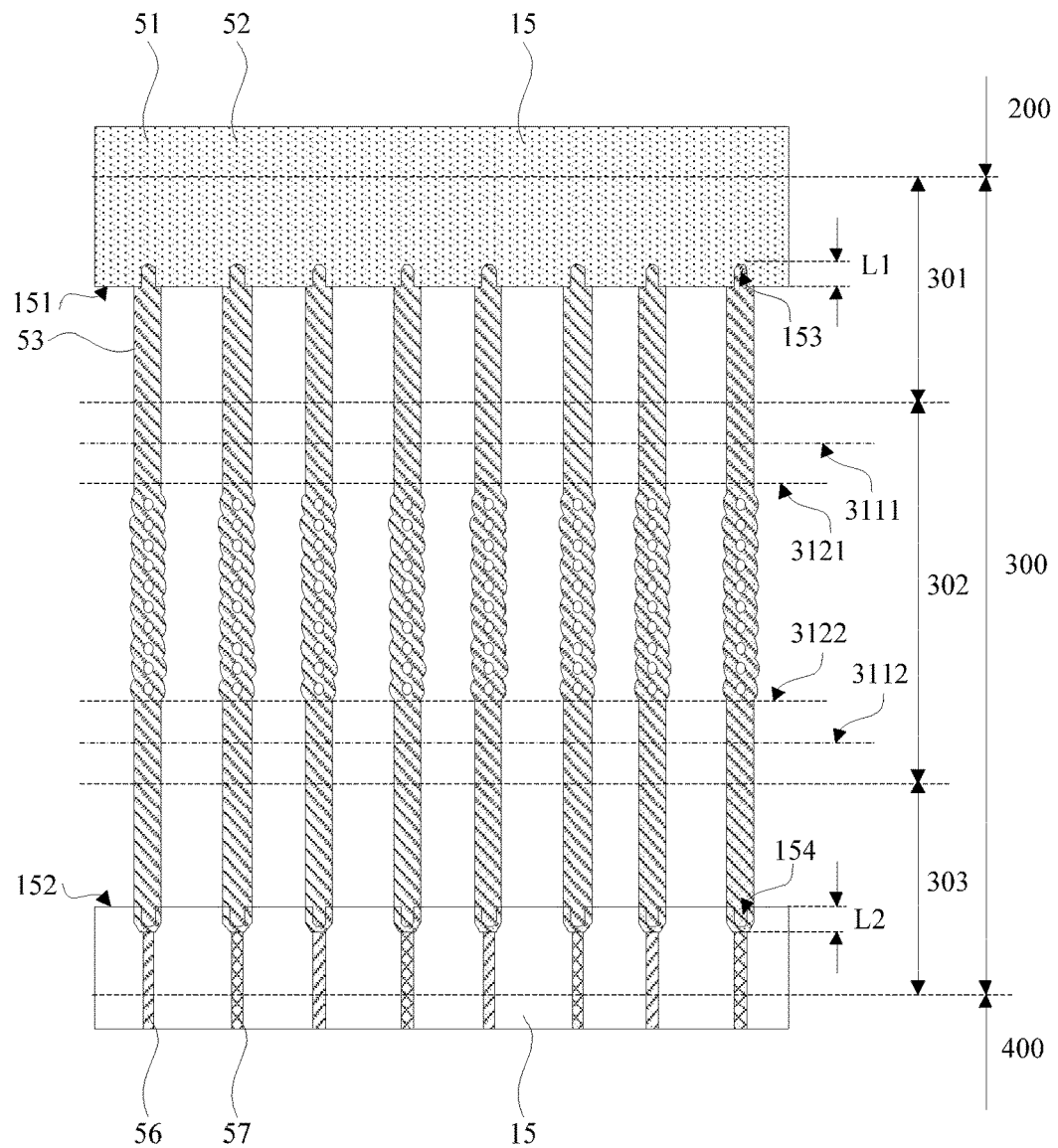
FIG. 31 is another schematic diagram of a structure of a bending region of a display substrate according to at least one embodiment of the present disclosure.
Figure 32:
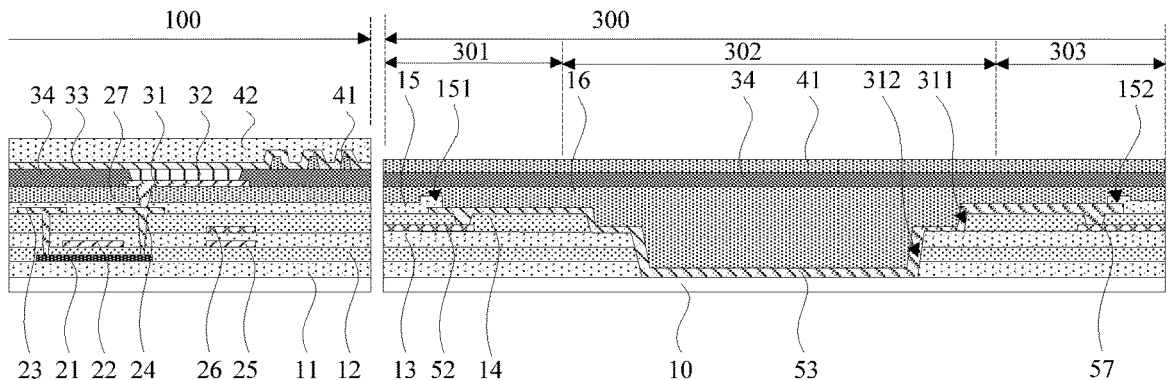
FIG. 32 is another cross sectional view along the P-P direction in FIG. 1.

FIG. 31 is another structural diagram of a bending region of a display substrate according to at least one embodiment of the present disclosure. FIG. 31 is a partially enlarged schematic diagram of the region S in FIG. 1. FIG. 32 is another cross sectional view along the P-P direction in FIG. 1.

In some exemplary embodiments, as shown in FIG. 31, in a plane parallel to the display substrate, the bending region 300 includes multiple first data lead wires 51, multiple second data lead wires 52, multiple first data connection lines 53, multiple fourth data connection lines 56 and multiple fifth data connection lines 57. A first data lead wire 51 is connected to a fourth data connection line 56 through a first data connection line 53, and a second data lead wire 52 is connected to a fifth data connection line 57 through a first data connection line 53. An inorganic insulator layer 15 has a first edge 151 and a second edge 152 in the bending region 300. A hollow region of the inorganic insulator layer 15 is formed between the first edge 151 and the second edge 152. The first edge 151 of the inorganic insulator layer 15 is located in the first region 301 of the bending region 300, and the second edge 152 of the inorganic insulator layer 15 is located in the third region 303 of the bending region 300. The first edge 151 of the inorganic insulator layer 15 directly contacts with the multiple first data connection lines 53 and covers edges of the multiple first data connection lines 53 close to the display region 100, and the second edge 152 covers edges of the multiple first data connection lines 53 away from the display region. The first edge 151 of the inorganic insulator layer 15 has a first wave structure including multiple first notches 153 disposed at intervals. The multiple first notches 153 correspond to the multiple first data connection lines 53 one by one, and an orthographic projection of at least one first notch 153 on the base substrate is located in an orthographic projection of a corresponding first data connection line 53 on the base substrate. The second edge 152 of the inorganic insulator layer 15 has a second wave structure including multiple second notches 154 disposed at intervals. The multiple second notches 154 correspond to the multiple first data connection lines 53 one by one, and an orthographic projection of at least one second notch 154 on the base substrate is located in an orthographic projection of a corresponding first data connection line 53 on the base substrate.

In some exemplary embodiments, as shown in FIG. 32, in a plane perpendicular to the display substrate, the display region 100 includes a base substrate 10, a drive structure layer disposed on the base substrate 10, an inorganic insulator layer 15 and a first planarization layer 16 sequentially disposed on the drive structure layer, a light-emitting element disposed on the second planarization layer 16, and an encapsulation layer 42 covering the light-emitting element. The drive structure layer of the display region 100 includes multiple transistors and at least one storage capacitor which form a pixel drive circuit, wherein the pixel drive circuit may have a design of 2T1C, 3T1C or 7T1C. In FIG. 32, one first transistor and one first storage capacitor are taken as an example. The first transistor may be a drive transistor. The drive structure layer of the display region 100 may include a buffer layer 11 disposed on the base substrate 10, an active layer disposed on the buffer layer 11, a first gate insulator layer 12 covering the active layer, a first gate metal layer disposed on the first gate insulator layer 12, a second gate insulator layer 13 covering the first gate metal layer, a second gate metal layer disposed on the second gate insulator layer 13, an interlayer dielectric layer 14 covering the second gate metal layer, and a source and drain metal layer disposed on the interlayer dielectric layer 14. The active layer may at least include a first active layer 21, the first gate metal layer may at least include a first gate electrode 22 and a first capacitor electrode 25, the second gate metal layer may at least include a second capacitor electrode 26, and the source and drain metal layer may at least include a first source electrode 23 and a first drain electrode 24. The first active layer 21, the first gate electrode 22, the first source electrode 23 and the first drain electrode 24 form a first transistor, and the first capacitor electrode 25 and the second capacitor electrode 26 form a first storage capacitor. The light emitting element may include an anode 31, a pixel definition layer 34, an organic light emitting layer 32, and a cathode 33. The anode 31 is connected to the first drain electrode 24 of the first transistor through via holes disposed on the first planarization layer 16 and the inorganic insulator layer 15. A side of a pixel definition layer 34 away from the base substrate 10 is provided with a post spacer layer 41. In some examples, the encapsulation layer 42 may include an inorganic encapsulation layer, an organic encapsulation layer and an inorganic encapsulation layer which are stacked. However, this is not limited in the present embodiment.

In some exemplary embodiments, as shown in FIG. 32, in a plane perpendicular to the display substrate, the first region 301 of the bending region 300 includes a base substrate 10, and a buffer layer 11, a first gate insulator layer 12, a first data lead wire layer, a second gate insulator layer 13, a second data lead wire layer, an interlayer dielectric layer 14, a second wiring layer, an inorganic insulator layer 15, a first planarization layer 16, a pixel definition layer 34 and a post spacer layer 41 which are sequentially disposed on the base substrate 10. The first data lead wire layer includes multiple first data lead wires (not shown in FIG. 32), and the second data lead wire layer includes multiple second data lead wires (one second data lead wire 52 is illustrated in FIG. 32). The second wiring layer includes multiple first data connection lines (one first data connection line 53 is illustrated in FIG. 32). The first data connection line 53 extends from the first region 301 to the third region 303 via the second region 302. An orthographic projection of one end of a first data connection line 53 close to the display region 100 on the base substrate 10 partially overlaps with an orthographic projection of one first data lead wire or one second data lead wire 52 on the base substrate, and an orthographic projection of one end of the first data connection line 53 away from the display region 100 partially overlaps with an orthographic projection of one fourth data connection line 56 or one fifth data connection line 57 on the base substrate 10. The first edge 151 of the inorganic insulator layer 15 covers an edge of the first data connection line 53 close to the display region 100, and the second edge 152 covers an edge of the first data connection line 53 away from the display region 100.

In some exemplary embodiments, as shown in FIG. 32, in a plane perpendicular to the display substrate, the second region 302 of the bending region 300 includes a base substrate 10, and a composite insulator layer, a first planarization layer 16, a pixel definition layer 34 and a post spacer layer 41 which are sequentially disposed on the base substrate 10. The composite insulator layer includes a buffer layer 11, a first gate insulator layer 12, a second gate insulator layer 13, and an interlayer dielectric layer 14 which are sequentially disposed on the base substrate 10. The composite insulator layer of the second region 302 is provided with a first groove 311 and a second groove 312. The interlayer dielectric layer 14 in the first groove 311 is etched off, and the interlayer dielectric layer 14, the second gate insulator layer 13, the first gate insulator layer 12 and the buffer layer 11 in the second groove 312 are all etched off. An orthographic projection of the second groove 312 on the base substrate 10 is located in an orthographic projection of the first groove 311 on the base substrate 10. The first planarization layer 16, the pixel definition layer 34 and the post spacer layer 41 are sequentially disposed in the first groove 311 and the second groove 312.

In some exemplary embodiments, as shown in FIG. 32, in a plane perpendicular to the display substrate, the third region 303 of the bending region 300 includes a base substrate 10, and a buffer layer 11, a first gate insulator layer 12, a first data lead wire layer, a second gate insulator layer 13, a second data lead wire layer, an interlayer dielectric layer 14, a second wiring layer, an inorganic insulator layer 15, a first planarization layer 16, a pixel definition layer 34 and a post spacer layer 41 which are sequentially disposed on the base substrate 10. The first data lead wire layer includes multiple fourth data connection lines (not shown in FIG. 32), and the second data lead wire layer includes multiple fifth data connection lines (one fifth data connection line 57 is illustrated in FIG. 32). In this exemplary embodiment, structures in the first region 301 and the third region 303 of the bending region 300 are symmetrical with each other, and the symmetry axis is perpendicular to an extending direction of the data connection lines. However, this is not limited in the present embodiment. In some examples, a structure in the third region of the bending region 300 may be different or partially the same as a structure in the first region.

The structure and the preparation process of the display substrate according to this exemplary embodiment is only an exemplary description. In some exemplary embodiments, corresponding structures may be changed and patterning processes may be added or reduced according to actual needs. For example, the multiple first data lead wires, the multiple second data lead wires, the multiple fourth data connection lines and the multiple fifth data connection lines may be disposed in a same layer as the first gate metal layer, or may be disposed in the same layer as the second gate metal layer. For another example, the first edge and the second edge of the inorganic insulator layer in the bending region may be straight edges. For another example, the display substrate may have a top emission structure or may have a bottom emission structure. For another example, the drive transistor may have a top gate structure, a bottom gate structure, a single gate structure, or a dual gate structure, which is not limited in the present embodiment. The structure (or method) shown in the present embodiment may be appropriately combined with the structure (or method) shown in another embodiment.

At least one embodiment of the present disclosure further provides a method for preparing a display substrate, which includes providing a base substrate including a display region and a bending region located on a side of the display region; forming multiple sub-pixels and multiple data lines on the base substrate in a display region, wherein the multiple data lines are electrically connected to the multiple sub-pixels, and the multiple data lines are configured to provide data signals to the multiple sub-pixels; forming a first wiring layer on the base substrate, wherein the first wiring layer is partially disposed in the bending region and is connected to the multiple data lines; forming a second wiring layer on a side of the first wiring layer away from the base substrate in the bending region, wherein the second wiring layer is connected to the first wiring layer; and forming a first insulator layer on a side of the second wiring layer away from the base substrate. Orthographic projections of the first insulator layer and an edge of the second wiring layer close to the display region on the base substrate overlap with each other.

In some exemplary embodiments, forming the first wiring layer on the base substrate includes sequentially forming a first data lead wire layer and a second data lead wire layer which are mutually insulated on the base substrate, wherein the first data lead wire layer includes multiple first data lead wires, and the second data lead wire layer includes multiple second data lead wires, and at least one first data lead wire or second data lead wire is configured to be connected to one data line. Orthographic projections of the first data lead wire layer and the second data lead wire layer on the base substrate do not overlap with each other, and the first data lead wires and the second data lead wires are disposed at intervals.

In some exemplary embodiments, forming the second wiring layer on the side of the first wiring layer away from the base substrate in the bending region includes forming multiple first data connection lines which are parallel to and insulated with each other on the side of the first wiring layer away from the base substrate in the bending region, wherein at least one first data connection line is connected to one first data lead wire or one second data lead wire.

In some exemplary embodiments, the preparation method of the present embodiment further includes forming an inorganic insulator layer on a side of the second wiring layer away from the base substrate, wherein the inorganic insulator layer is located between the second wiring layer and the first insulator layer. The inorganic insulator layer includes a first edge in the bending region, and the first edge of the inorganic insulator layer overlaps with an orthographic projection of an edge of the second wiring layer close to the display region on the base substrate.

In some exemplary embodiments, the preparation method of the present embodiment further includes forming a third wiring layer on a side of the inorganic insulator layer away from the base substrate in the bending region. The third wiring layer includes multiple second data connection lines. Here, forming the second wiring layer on the side of the first wiring layer away from the base substrate in the bending region includes forming multiple first data connection lines and multiple third data connection lines on the side of the first wiring layer away from the base substrate in the bending region. The multiple third data connection lines are located on a side of the multiple first data connection lines away from the display region. At least one first data connection line is connected to one first data lead wire or one second data lead wire, and two ends of at least one second data connection line are respectively connected to one first data connection line and one third data connection line.

In some exemplary embodiments, the first data lead wire layer further includes multiple fourth data connection lines, and the second data lead wire layer further includes multiple fifth data connection lines. The multiple fourth data connection lines are located on a side of the multiple first data lead wires away from the display region, and at least one fourth data connection line is connected to one first data lead wire through one third data connection line, one second data connection line and one first data connection line. The multiple fifth data connection lines are located on a side of the multiple second data lead wires away from the display region, and at least one fifth data connection line is connected to one second data lead wire through one third data connection line, one second data connection line and one first data connection line.

In some exemplary embodiments, the preparation method of the present embodiment further includes forming an active layer on the base substrate of the display region; forming a first gate metal layer in the display region while forming the first data lead wire layer; forming a second gate metal layer in the display region while forming the second data lead wire layer; forming a source and drain electrode layer in the display region while forming the second wiring layer in the bending region; forming a metal conductive layer in the display region while forming the third wiring layer in the bending region; and forming a light emitting element in the display region. The light-emitting element is connected to the source and drain electrode layer through the metal conductive layer.

For the preparation method of the present embodiment, reference may be made to the description of the previous embodiments, and therefore it will not be further described here.

Figure 33:
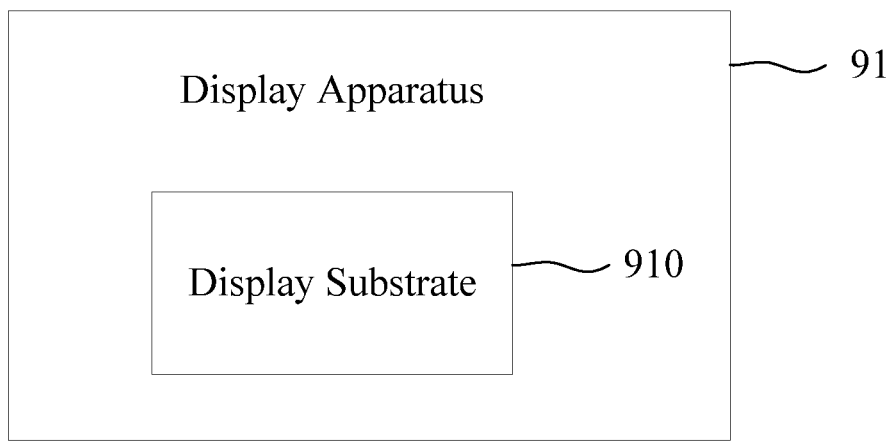
FIG. 33 is a schematic diagram of a display apparatus according to at least one embodiment of the present disclosure.

FIG. 33 is a schematic diagram of a display apparatus according to at least one embodiment of the present disclosure. As shown in FIG. 33, the present embodiment provides a display apparatus 91, which includes a display substrate 910. The display substrate 910 is the display substrate provided in the previous embodiments. Here, the display substrate 910 may be an OLED display substrate. The display apparatus may be any product or component with a display function such as an OLED display substrate, a mobile phone, a tablet computer, a television, a display, a laptop computer, a digital photo frame, a navigator, etc. However, this is not limited in the present embodiment.

The drawings in the present disclosure only refer to the structures involved in the present disclosure, and common designs may be referred to for other structures. The embodiments of the present disclosure and the features in the embodiments may be combined with each other to obtain a new embodiment where there is no conflict.

Those of ordinary skills in the art should understand that modifications or equivalent substitutions may be made to the technical solutions of the present disclosure without departing from the spirit and scope of the technical solutions of the present disclosure, all of which should be included in the scope of the claims of the present disclosure.

What is claimed is:

1. A display substrate, comprising:
   a base substrate comprising a display region and a bending region located on a side of the display region;
   a plurality of sub-pixels located in the display region;
   a plurality of data lines located in the display region and electrically connected to the plurality of sub-pixels, wherein the plurality of data lines are configured to provide data signals to the plurality of sub-pixels;
   a first wiring layer partially disposed in the bending region of the base substrate, wherein the first wiring layer is connected to the plurality of data lines;
   a second wiring layer located in the bending region and disposed on a side of the first wiring layer away from the base substrate, wherein the second wiring layer is connected to the first wiring layer; and
   a first insulator layer disposed on a side of the second wiring layer away from the base substrate, wherein an orthographic projection of the first insulator layer on the base substrate overlaps with an orthographic projection of the second wiring layer on the base substrate;
   a third wiring layer located in the bending region and disposed on a side of the first insulator layer away from the base substrate;

an inorganic insulator layer located between the second wiring layer and the first insulator layer;

wherein the first insulator layer comprises a plurality of first openings in the bending region, the third wiring layer is electrically connected to the second wiring layer through the plurality of first openings;

wherein the inorganic insulator layer is a passivation layer having a first edge located in the bending region, in the bending region of the base substrate, there is a projection overlap between an orthographic projection of the inorganic insulator layer on the base substrate and the orthographic projection of the second wiring layer on the base substrate, wherein an outer boundary of the projection overlap in a cross section is the first edge of the inorganic insulator layer and an inner boundary of the projection overlap in the cross section is an edge of the second wiring layer located in the bending region and facing away from a center of the bending region, and no opening is disposed within any portion of the inorganic insulator layer corresponding to the projection overlap;

the orthographic projection of the inorganic insulator layer on the base substrate does not overlap with an orthographic projection of the plurality of first openings of the first insulator layer on the base substrate.

2. The display substrate according to claim 1, wherein the first wiring layer comprises a plurality of data lead wires, and the plurality of data lead wires are connected to the plurality of data lines in a one-to-one correspondence;

the second wiring layer comprises a plurality of first data connection lines which are connected to the plurality of data lead wires in a one-to-one correspondence; and the first insulator layer directly contacts with at least part of the second wiring layer.

3. The display substrate according to claim 1, wherein the first edge of the inorganic insulator layer located in the bending region is provided with a first wave structure, and the first wave structure comprises a plurality of first notches disposed at intervals; and in the bending region of the display substrate, an orthographic projection of at least one of the plurality of first notches on the base substrate is located in an orthographic projection of a corresponding first data connection line of the plurality of first data connection lines of the second wiring layer on the base substrate.

4. The display substrate according to claim 2, wherein the plurality of first data connection lines of the second wiring layer are disposed in a staggered manner.

5. The display substrate according to claim 1, wherein the third wiring layer comprises a plurality of second data connection lines which are connected to the plurality of first data connection lines of the second wiring layer in a one-to-one correspondence; and an orthographic projection of at least one of the plurality of second data connection lines on the base substrate partially overlaps with an orthographic projection of a corresponding first data connection line on the base substrate.

6. The display substrate according to claim 5, wherein at least one of the plurality of second data connection lines has at least one hole, and the at least one hole is a round hole or an elliptical hole.

7. The display substrate according to claim 5, wherein the second wiring layer further comprises a plurality of third data connection lines;

the plurality of third data connection lines are located on a side of the plurality of first data connection lines away from the display region, and the plurality of third data connection lines are connected to the plurality of second data connection lines in a one-to-one correspondence; and two ends of at least one of the plurality of second data connection lines are respectively connected to one of the first data connection lines and one of the third data connection lines.

8. The display substrate according to claim 7, wherein the plurality of third data connection lines of the second wiring layer are disposed in a staggered manner.

9. The display substrate according to claim 7, wherein the inorganic insulator layer further comprises a second edge in the bending region, and the second edge is located on a side of the first edge of the inorganic insulator layer away from the display region, and a hollow region of the inorganic insulator layer is between the first edge and the second edge of the inorganic insulator layer; and the second edge of the inorganic insulator layer directly contacts with at least one of the third data connection lines of the second wiring layer, and the second edge covers an edge of the third data connection line away from the display region.

10. The display substrate according to claim 9, wherein the second edge of the inorganic insulator layer is provided with a second wave structure, and the second wave structure comprises a plurality of second notches disposed at intervals; and an orthographic projection of at least one of the plurality of second notches on the base substrate is located in an orthographic projection of a corresponding third data connection line on the base substrate.

11. The display substrate according to claim 1, wherein the first edge of the inorganic insulator layer directly contacts with at least one of the first data connection lines of the second wiring layer and covers an edge of the first data connection line close to the display region.

12. The display substrate according to claim 1, wherein in the bending region, along a direction from the bending region to the display region, a distance between the first edge of the inorganic insulator layer and an edge of the second wiring layer covered by the first edge is greater than or equal to 5 microns.

13. The display substrate according to claim 2, wherein an orthographic projection of at least one of the plurality of first data connection lines on the base substrate comprises an orthographic projection of at least one of the first openings on the base substrate.

14. The display substrate according to claim 1, wherein the first wiring layer comprises a first data lead wire layer and a second data lead wire layer which are sequentially disposed on the base substrate and mutually insulated; the first data lead wire layer comprises a plurality of first data lead wires, and the second data lead wire layer comprises a plurality of second data lead wires; and an orthographic projection of the first data lead wire layer on the base substrate do not overlap with an orthographic projection of the second data lead wire layer on the base substrate, and the first data lead wires and the second data lead wires are disposed at intervals;

wherein the first data lead wire layer further comprises a plurality of fourth data connection lines located on a side of the plurality of first data lead wires away from the display region, and the plurality of fourth data connection lines are connected to the plurality of first data lead wires in a one-to-one correspondence at least through the second wiring layer;

the second data lead wire layer further comprises a plurality of fifth data connection lines which are located on a side of the plurality of second data lead wires away from the display region and are connected to the plurality of second data lead wires in a one-to-one correspondence at least through the second wiring layer.

15. The display substrate according to claim 14, wherein the display region at least comprises a drive structure layer disposed on the base substrate and a light emitting element disposed on the drive structure layer, the light emitting element is connected to the drive structure layer; and the drive structure layer comprises an active layer, a first gate metal layer, a second gate metal layer and a source and drain electrode layer which are sequentially disposed on the base substrate; and the first data lead wire layer and the first gate metal layer are in a same layer, the second data lead wire layer and the second gate metal layer are in a same layer, and the second wiring layer and the source and drain electrode layer are in a same layer.

16. The display substrate according to claim 1, wherein the bending region comprises a first region, a second region and a third region sequentially disposed along a direction away from the display region; the second region comprises a composite insulator layer, and the composite insulator layer is disposed between the base substrate and the second wiring layer; the composite insulator layer is provided with a first groove and a second groove which are communicated; an orthographic projection of the first groove on the base substrate comprises an orthographic projection of the second groove on the base substrate; and the composite insulator layer comprises a barrier layer, a buffer layer, a first gate insulator layer, a second gate insulator layer and an interlayer dielectric layer which are stacked on the base substrate; the first groove exposes the buffer layer, and the second groove exposes the base substrate.

17. The display substrate according to claim 16, wherein the first insulator layer is filled at least in the second groove; or the first insulator layer fills the first groove and the second groove.

18. The display substrate according to claim 1, wherein the first insulator layer is an organic insulator layer.

19. A display apparatus, comprising the display substrate according to claim 1.

* * * * *